United States Patent
Hall et al.

(10) Patent No.: US 12,363,936 B2
(45) Date of Patent: Jul. 15, 2025

(54) NANOSHEET TRANSISTORS WITH REDUCED SOURCE/DRAIN RESISTANCE AND ASSOCIATED METHOD OF MANUFACTURE

(71) Applicant: NXP USA, Inc., Austin, TX (US)

(72) Inventors: Mark Douglas Hall, Austin, TX (US); Craig Allan Cavins, Austin, TX (US); Tushar Praful Merchant, Austin, TX (US); Asanga H. Perera, West Lake Hills, TX (US)

(73) Assignee: NXP USA, Inc., Austin, TX (US)

(*) Notice: Subject to any disclaimer, the term of this patent is extended or adjusted under 35 U.S.C. 154(b) by 511 days.

(21) Appl. No.: 17/692,662

(22) Filed: Mar. 11, 2022

(65) Prior Publication Data

US 2023/0290862 A1    Sep. 14, 2023

(51) Int. Cl.
| | | |
|---|---|---|
| H01L 29/66 | (2006.01) | |
| H01L 27/12 | (2006.01) | |
| H10D 30/01 | (2025.01) | |
| H10D 30/67 | (2025.01) | |
| H10D 30/69 | (2025.01) | |
| H10D 62/13 | (2025.01) | |
| H10D 86/01 | (2025.01) | |
| H10D 86/40 | (2025.01) | |

(Continued)

(52) U.S. Cl.
CPC ....... *H10D 30/031* (2025.01); *H10D 30/6729* (2025.01); *H10D 30/6757* (2025.01); *H10D 30/797* (2025.01); *H10D 62/151* (2025.01); *H10D 86/0221* (2025.01); *H10D 86/40* (2025.01); *H10D 86/60* (2025.01); *H10D 30/6735* (2025.01); *H10D 30/6737* (2025.01); *H10D 30/6743* (2025.01); *H10D 64/018* (2025.01)

(58) Field of Classification Search
None
See application file for complete search history.

(56) References Cited

U.S. PATENT DOCUMENTS

| | | | |
|---|---|---|---|
| 6,852,578 B2 | 2/2005 | Chang | |
| 8,389,416 B2 * | 3/2013 | Luong | H01L 29/0673 438/714 |
| 10,109,533 B1 * | 10/2018 | Xie | H01L 29/78654 |

(Continued)

OTHER PUBLICATIONS

Ritzenthaler, R., "Comparison of Electrical Performance of Co-Integrated Forksheets and Nanosheets Transistors for the 2nm Technological Node and Beyond", 2021 IEEE International Electron Devices Meeting (IEDM), Dec. 11, 2021.

(Continued)

*Primary Examiner* — Shamim Ahmed

(57) ABSTRACT

A semiconductor device and fabrication method are described for forming a nanosheet transistor device by forming a nanosheet transistor stack (12-18, 25) of alternating Si and SiGe layers which are selectively processed to form metal-containing current terminal or source/drain regions (27, 28) and to form control terminal electrodes (36A-D) which replace the SiGe layers in the nanosheet transistor stack and are positioned between the Si layers which form transistor channel regions in the nanosheet transistor stack to connect the metal source/drain regions, thereby forming a nanosheet transistor device.

14 Claims, 17 Drawing Sheets

(51) Int. Cl.
*H10D 86/60* (2025.01)
*H10D 64/01* (2025.01)

(56) References Cited

U.S. PATENT DOCUMENTS

| | | |
|---|---|---|
| 2018/0151732 A1 | 5/2018 | Mehandru et al. |
| 2019/0131184 A1 | 5/2019 | Ando et al. |
| 2019/0348498 A1 | 11/2019 | Cheng et al. |
| 2020/0105889 A1 | 4/2020 | Liaw |
| 2021/0119045 A1 | 4/2021 | Reznicek et al. |
| 2021/0305410 A1* | 9/2021 | Yao .................... H01L 29/0653 |
| 2021/0408009 A1 | 12/2021 | Zheng et al. |

OTHER PUBLICATIONS

Jin Cai et al., TSMC, Device Technology for 3 nm Node and Beyond, Apr. 6, 2021.

Emilie Bernard et al., First Internal Spacers' Introduction in Record High ION/IOFF TiN/HfO2 Gate Multichannel MOSFET Satisfying Both High-Performance and Low Standby Power Requirements, IEEE Electron Device Letters, vol. 30, No. 2, pp. 148-151, Feb. 2009.

S.B. Samavedam et al., Future Logic Scaling: Towards Atomic Channels and Deconstructed Chips, 2020 IEEE International Electron Devices Meeting (IEDM), 2020, pp. 1.1.1-1.1.10, doi: 10.1109/IEDM13553.2020.9372023.

Peide Ye et al., The Nanosheet Transistor Is the Next (and Maybe Last) Step in Moore's Law, Nanosheet devices are scheduled for the 3-nanometer node as soon as 2021, IEEE Spectrum Jul. 30, 2019.

* cited by examiner

NANOSHEET TRANSISTORS WITH REDUCED SOURCE/DRAIN RESISTANCE AND ASSOCIATED METHOD OF MANUFACTURE

BACKGROUND OF THE INVENTION

Field of the Invention

The present invention is directed in general to the field of semiconductor devices. In one aspect, the present invention relates to integrated nanosheet field effect transistors (FET) devices and methods of fabricating same in a nanosheet process flow.

Description of the Related Art

As semiconductor device sizes are scaled down, the requirements for device design and fabrication continue to be tightened in order to fit more circuitry on smaller chips. As device sizes shrink, increasingly complex process integrations are used to define semiconductor device features and structures. For example, finFET transistors replaced planar FET transistors as the leading-edge transistor architecture for 1x nm nodes, but with next-generation technologies, stacked nanosheet transistors are in line to replace finFETs as the leading edge transistor architecture starting at the 3 nm node. However, with existing solutions for fabricating nanosheet transistors, there are performance challenges which arise from the geometric structure and scale of the nanosheet FET devices. For example, the vertical nature of the gate-all-around nanosheet transistors, including Complementary FETs (CFETs), can result in high resistance values for the source/drain regions. The high source/drain resistance causes the lower nanosheet portions of the FET devices to provide less drive current per unit of device capacitance, thereby reducing the efficiency of the lower nanosheet channels.

As seen from the foregoing, existing nanosheet FET devices and methods for fabricating them are extremely difficult at a practical level by virtue of the challenges with fabricating leading edge nanosheet transistors while meeting the performance requirements and cost constraints. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
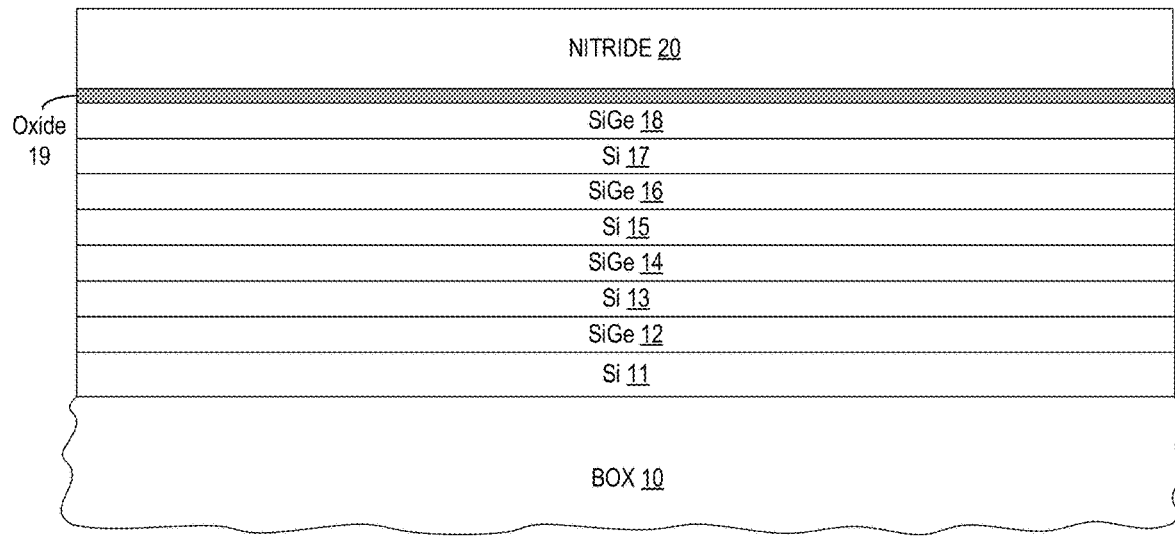
FIG. 1 is a partial cross-sectional view of a semiconductor structure including a Si/SiGe superlattice with oxide and nitride cover layers formed over substrate in accordance with selected first embodiments of the present disclosure.

A semiconductor device and fabrication method are described for fabricating nanosheet transistor devices with low-resistance source/drain regions in a single nanosheet process flow. While specific implementation details are described herein with reference to one or more example embodiments, the present disclosure is directed to fabricating nanosheet FET devices with source/drain regions formed to include low resistance metal and silicide layers for contacting silicon channel layers in a nanosheet transistor stack. The steps used for fabricating the nanosheet FET devices are standard process steps used for fabricating the nanosheet transistors, so no new fab tools may be needed. As an initial set of fabrication steps, nanosheet transistors may be obtained by patterning and etching an initial Si/SiGe superlattice substrate structure to form separate transistor stacks which are processed using nanosheet process steps to form ALD metal gate stacks in the transistor stacks. Either before or after forming the ALD metal gate stacks, silicide source/drain channel sidewalls are formed along with planarized metal source/drain regions adjacent to the transistor stack to directly or indirectly contact silicon channel layers in the transistor stack. In selected first embodiments, silicide source/drain channel sidewalls are formed on exposed silicon channel layers of the transistor stack before forming planarized tungsten source/drain regions in contact with the silicide source/drain channel sidewalls, followed by forming the ALD metal gate stacks in the transistor stacks. In selected second embodiments, recessed silicide source/drain channel sidewalls are formed on recess-etched silicon channel layers of the transistor stack before forming planarized tungsten source/drain regions in contact with the silicide source/drain channel sidewalls, followed by forming the ALD metal gate stacks in the transistor stacks. In selected third embodiments, epitaxial silicon source/drain regions are formed on exposed silicon channel layers of the transistor stack before forming silicide source/drain channel sidewalls on the epitaxial silicon source/drain regions and then forming planarized tungsten source/drain regions in contact with the silicide source/drain channel sidewalls, followed by forming the ALD metal gate stacks in the transistor stacks. In selected fourth embodiments, epitaxial silicon source/drain regions are formed adjacent to the transistor stack and subsequently patterned and etched to form remnant epitaxial silicon source/drain regions on sidewalls of the transistor stack before forming silicide source/drain channel sidewalls on the remnant epitaxial silicon source/drain regions and then forming planarized tungsten source/drain regions in contact with the silicide source/drain channel sidewalls.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

Various illustrative embodiments of the present invention will now be described in detail with reference to FIGS. 1-33. It is noted that, throughout this detailed description, certain layers of materials will be deposited and removed to form the semiconductor structure. Where the specific procedures for processing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art how to make or use the present invention.

One of the challenges with gate-all-around nanosheet transistors, and particularly CFETs (Complementary FETs), is that they can suffer from high source/drain resistance because of the vertical nature of the nanosheet transistor stacks. In particular, the longer distance through the source/drain regions to reach the lower nanosheet channels in the transistor stack results in higher source/drain resistance to the lower nanosheets, thereby reducing the drive current per unit of device capacitance and making the lower nanosheet channels less efficient. In other words, as additional nanosheets are stacked together as logic scaling increases (e.g., with CFET transistor stacks), the corresponding increase in the height of the source/drain regions (and resulting increase in source/drain resistance) will reduce the speed and power performance since the bottom nanosheet(s) carry less current while adding the same capacitance as the upper nanosheets.

Turning now to FIG. 1, a partial cross-sectional view illustrates a semiconductor structure including a Si/SiGe superlattice 11-18 which is formed over a buried oxide (BOX) or dielectric layer 10 and covered by a protective oxide layer 19 and nitride layer 20 in accordance with selected embodiments of the present disclosure. Though not shown, it will be appreciated that the semiconductor structure 10-20 is formed over an underlying substrate which may be implemented as a bulk silicon substrate, monocrystalline silicon (doped or undoped), or any semiconductor material including, for example, Si, SiC, SiGe, SiGeC, Ge, GaAs, InAs, InP as well as other Group III-V compound semiconductors or any combination thereof, and may be formed as the bulk handling wafer.

As will be appreciated, any suitable sequence of processing steps may be used to form the Si/SiGe superlattice 11-18 on the base structure BOX layer 10, such as by epitaxially growing a plurality of nanosheet semiconductor layers of alternating silicon (Si) and silicon germanium (SiGe). As shown, the depicted Si/SiGe superlattice 11-18 is a stack of alternating layers which includes a first group of layers 11, 13, 15, 17 that include silicon and a second group of layers 12, 14, 16, 18 that include silicon germanium. While the Si/SiGe superlattice 11-18 is shown with four silicon nanosheets 11, 13, 15, 17, it will be appreciated that the number of silicon nanosheets may be decreased or increased (e.g., 5 Si nanosheets instead of 4 Si nanosheets) to optimize transistor performance. If desired, the individual layers of the Si/SiGe superlattice 11-18 may be doped or implanted with impurities to control the conductivity of the Si/SiGe superlattice 11-18.

The terms "epitaxial growth, "epitaxial deposition" and "epitaxial formation" all refer generally to a semiconductor process for forming, depositing, growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. For example, epitaxial semiconductor layers, such as epitaxial silicon, are often grown using vapor-phase epitaxy (VPE), a modification of chemical vapor deposition. Molecular-beam and liquid-phase epitaxy (MBE and LPE) are also used, mainly for compound semiconductors. Solid-phase epitaxy is used primarily for crystal-damage healing or for crystallizing a deposited film of amorphous material on a crystalline substrate. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. Furthermore, it will be appreciated that, although processes herein may be described as epitaxial growth processes, other suitable methods of forming epitaxial layers may be employed.

After forming the Si/SiGe superlattice 11-18, a first insulator or dielectric layer 19 is formed, such as by depositing or otherwise forming a protective oxide layer 19 over the semiconductor substrate using chemical vapor deposition (CVD), plasma-enhanced chemical vapor deposition (PECVD), physical vapor deposition (PVD), atomic layer deposition (ALD), thermal oxidation, or any combination(s) of the above to a thickness of approximately 20-200 Angstroms, though a thinner or thicker oxide layer may also be used. In addition, an insulator or dielectric layer 20 may be formed on the protective oxide layer 19, such as by depositing or otherwise forming a protective nitride layer 20 to a predetermined thickness. As will be appreciated, the unetched Si/SiGe superlattice 11-18 and cover layers 19, 20 are formed to cover the entire top surface of the buried oxide layer 10, including the intended nanosheet transistor areas.

Figure 2:
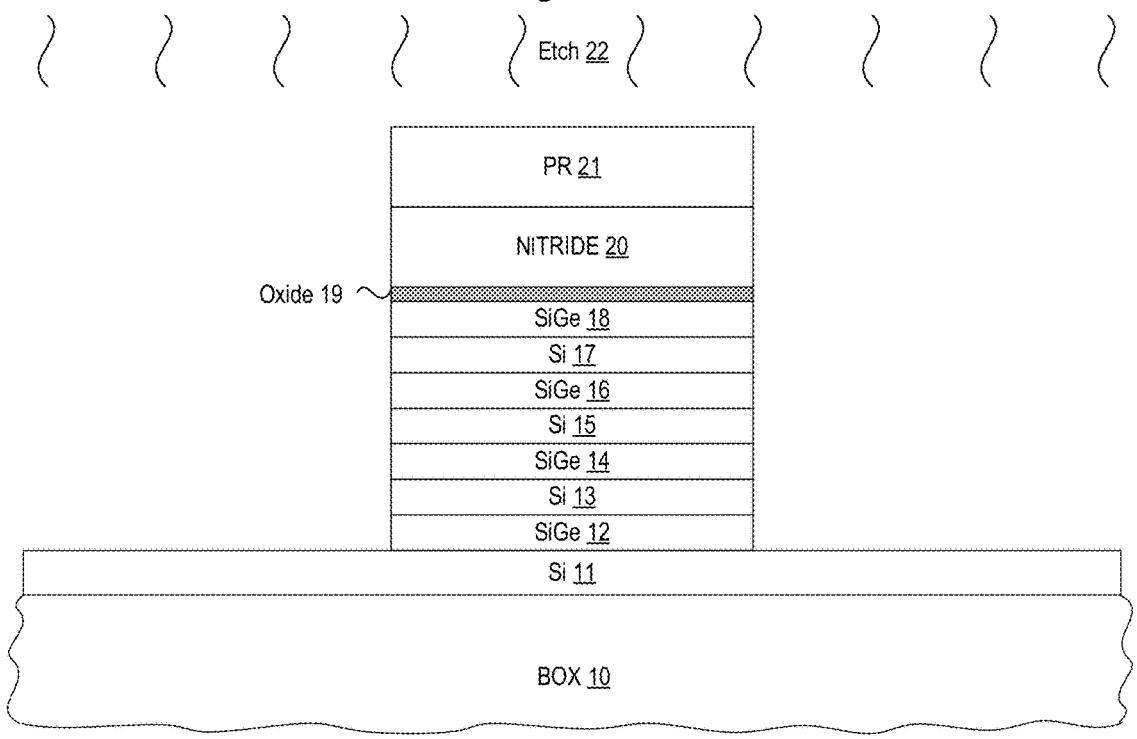
FIG. 2 illustrates processing of the semiconductor structure subsequent to FIG. 1 after the Si/SiGe superlattice and cover layers are patterned and etched to form a transistor stack.

FIG. 2 illustrates processing of the semiconductor structure subsequent to FIG. 1 after the Si/SiGe superlattice is patterned and etched to form a transistor stack. While any suitable pattern and etch process may be used, a first patterned mask 21 may be formed over the Si/SiGe superlattice 11-18 and protective layers 19, 20 by depositing, patterning, etching or developing a photoresist or hard mask layer 21 on the nitride layer 20. With the patterned photoresist mask 21 in place, one or more etch processes 22 are applied to create a transistor stack 12-20. The etch processing can include using the patterned photoresist mask 21 to perform a sequence of reactive-ion etching (RIE) steps having suitable etch chemistry properties to remove, in sequence, the exposed portions of the protective nitride layer 20, oxide layer 19, and underlying layers of the Si/SiGe superlattice 12-18, but without removing the bottom silicon nanosheet layer 11. As will be appreciated, the sidewalls of the transistor stack 12-20 are substantially vertical, though minor deviations in the sidewall profile may occur at each layer due to etch processing variations.

Figure 3:
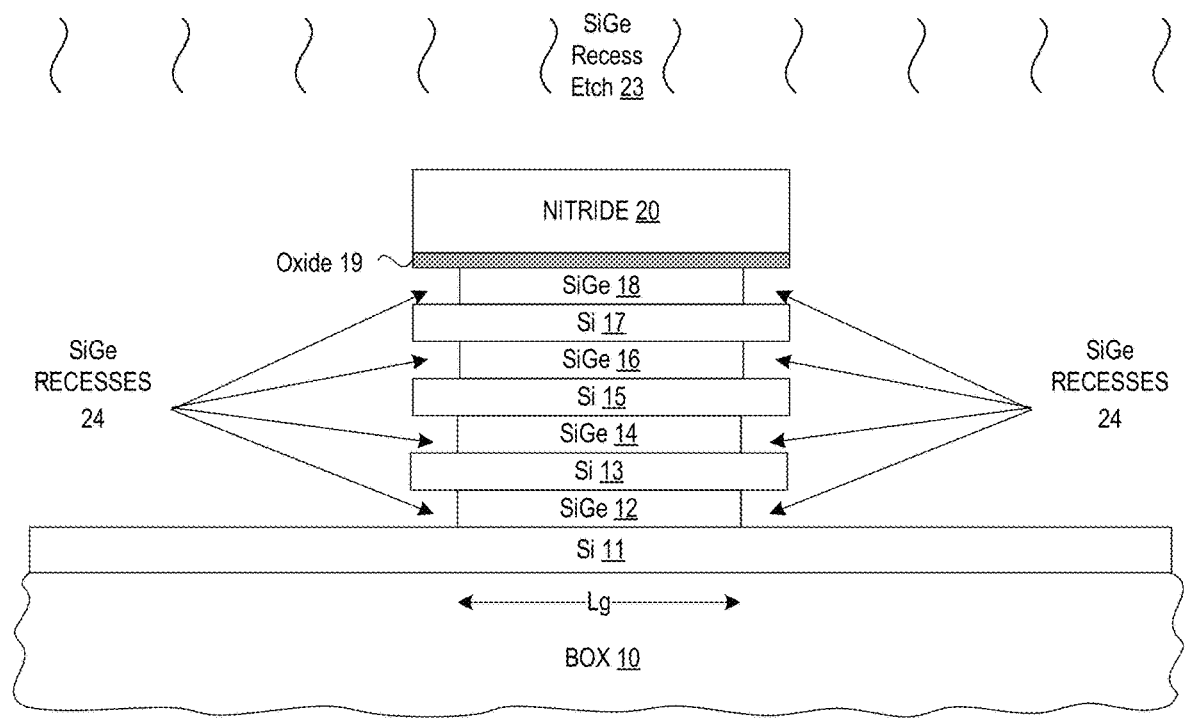
FIG. 3 illustrates processing of the semiconductor structure subsequent to FIG. 2 after selectively recessing SiGe layers to form recess openings on the exposed sides of the transistor stack.

FIG. 3 illustrates processing of the semiconductor structure subsequent to FIG. 2 after selectively recessing SiGe layers to form recess openings 24 on the exposed sides of the transistor stack. At the depicted processing stage, the patterned mask 21 has been removed using any suitable stripping process and a selective SiGe recess etch 23 is applied to selectively and isotropically recess the SiGe layers on the exposed sides of the transistor stack 12-20. While any suitable SiGe etch process may be used, a controlled SiGe recess etch process 23, such as a timed isotropic dry etch, may be used to remove a portion of each SiGe layer from the exposed sides of the transistor stack 12-20. At the conclusion of the etching process, the remnant SiGe portions 12, 14, 16, 18 of the transistor stack remain where the recess openings 24 have not been formed, and will define a first gate length dimension Lg for the subsequently formed nanosheet transistor. As will be appreciated, the etched sidewall edges of the remnant SiGe portions 12, 14, 16, 18 may have a substantially vertical or slightly curved profile resulting from the selective SiGe recess etch 23.

Figure 4:
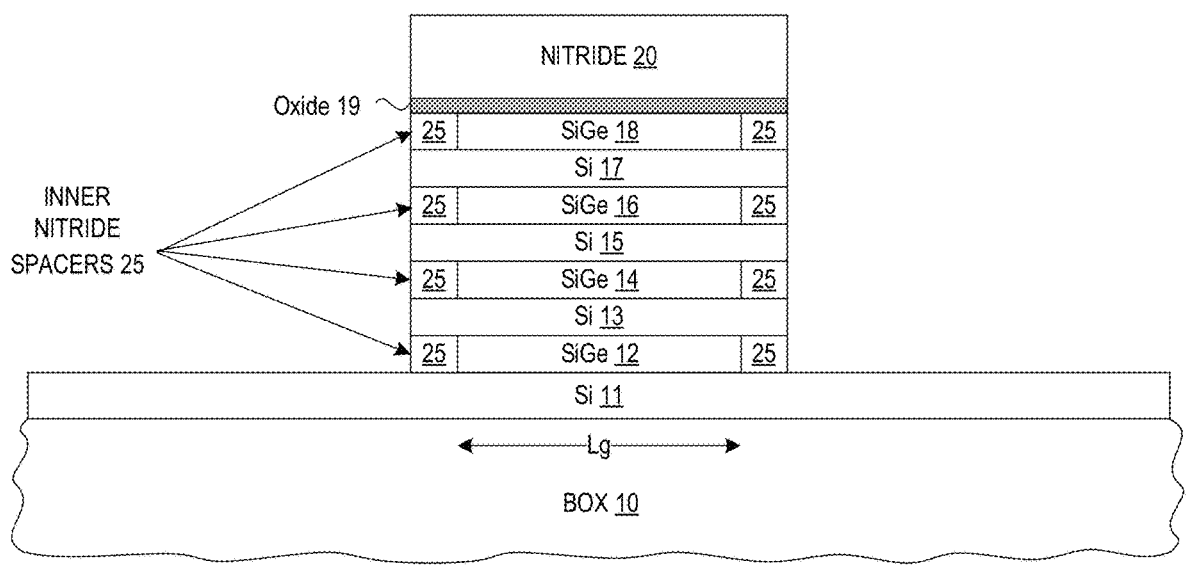
FIG. 4 illustrates processing of the semiconductor structure subsequent to FIG. 3 after forming inner spacers to fill recess openings on the exposed sides of the transistor stack.

FIG. 4 illustrates processing of the semiconductor structure subsequent to FIG. 3 after forming inner spacers 25 to fill recess openings on the exposed sides of the transistor stack. While any suitable spacer formation sequence may be used, the inner spacers 25 may be formed by depositing one or more dielectric layers, such as an oxide and/or nitride layer, over the semiconductor structure (not shown) that are subsequently etched to remove the dielectric layer(s) from the top and sides of the transistor stack but leaving remnant dielectric spacers 25 in the recess openings 24 at the exposed sides of the transistor stack 12-20. For example, an inner nitride layer may be deposited over the semiconductor structure to a predetermined thickness that is sufficient to cover at least the transistor stack 12-20 and fill the recess openings 24 on the exposed sides thereof. By applying an isotropic nitride etch process (e.g., RIE) to remove the inner nitride layer from the top and sides of the transistor stack 12-20, the remnant inner nitride layers form sidewall spacers 25 on the transistor stack. As will be appreciated, the etched sidewall edges of the remnant nitride spacers 25 may have a substantially vertical or slightly curved profile resulting from the applied isotropic nitride etch process.

Figure 5:
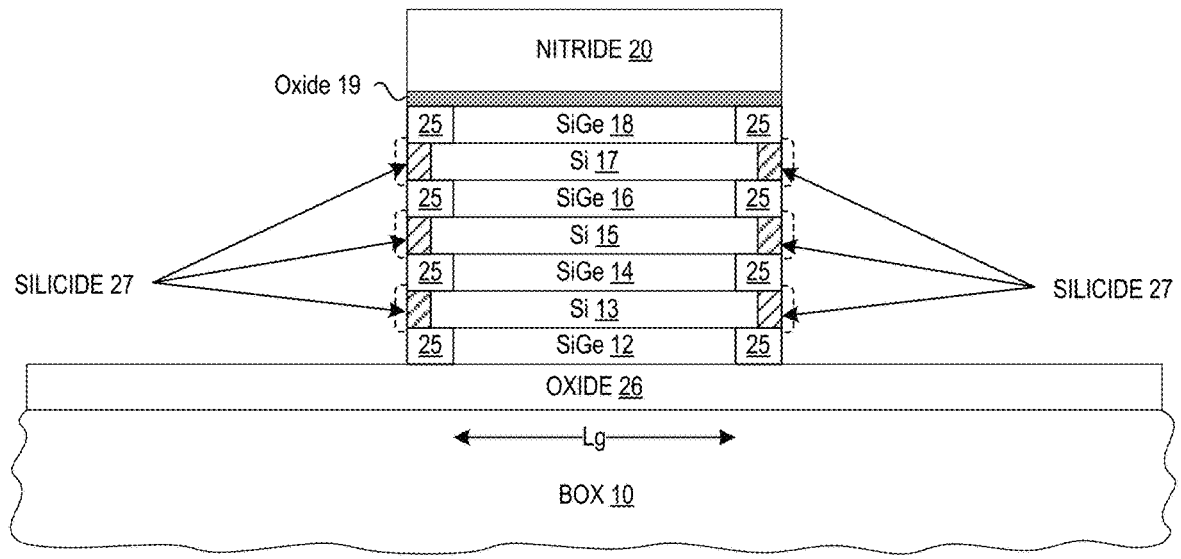
FIG. 5 illustrates processing of the semiconductor structure subsequent to FIG. 4 after forming a replacement oxide layer at the bottom of the transistor stack and forming silicide source/drain contact layers on exposed sidewalls of the silicon layers in the transistor stack.

FIG. 5 illustrates processing of the semiconductor structure subsequent to FIG. 4 after forming a replacement oxide layer 26 at the bottom of the transistor stack 12-20 and forming silicide source/drain contact layers 27 on exposed sidewalls of the silicon nanosheet layers 13, 15, 17 in the transistor stack 12-20. While any suitable process may be used to form the replacement oxide layer 26, in selected embodiments, a patterned photoresist layer or etch mask may be formed (not shown) with an opening between the transistor stacks which exposes the bottom silicon nanosheet layer 11 so that a suitable lateral silicon etch (e.g., isotropic silicon wet etch) is applied to remove the bottom silicon nanosheet layer 11 except for stack ends in the width dimension (e.g., perpendicular to the gate length dimension) that remain to support the transistor stack 12-20. After etching the bottom silicon nanosheet layer 11, the resulting opening is filled with one or more oxide layers to form the replacement oxide layer 26. For example, one or more conformal CVD oxide layers may be formed to fill the opening and form the replacement oxide layer 26. Subsequently, the remnant stack ends of the bottom silicon nanosheet layer 11 can be etched away in subsequent processing.

After forming the replacement oxide layer 26, silicide source/drain contact layers 27 are formed on exposed sidewalls of the silicon nanosheet layers 13, 15, 17 in the transistor stack 12-20 to facilitate electrical connection between the silicon nanosheet channel layers 13, 15, 17 and the subsequently-formed source/drain regions. While any desired silicide formation process may be used to form the silicide layers 27 (such as $CoSi_2$ or NiSi), an example silicide formation sequence would be to deposit or sputter a conductive or metal layer (e.g., cobalt or nickel) over the semiconductor structure, followed by a heating step to react the metal layer with the exposed sidewalls of the silicon nanosheet layers 13, 15, 17 to form silicide layers 27. In an illustrative embodiment, the reaction of the metal layer and the silicon nanosheet channel layers 13, 15, 17 is promoted by performing an initial rapid thermal anneal step (e.g., 400-600° C.), followed by a Piranha clean step to remove excess metal, and then followed by a second rapid thermal anneal step (e.g., 650-850° C.). The timing and temperature of the initial rapid thermal anneal step are selected so that the metal layer reacts with the exposed surfaces of the silicon nanosheet channel layers 13, 15, 17. After the Piranha clean step, the timing and temperature of the second rapid thermal anneal step are selected so that the reacted silicide layer 27 is pushed into a low resistivity phase. As will be appreciated, the thickness of the silicide source/drain contact layers 27 may be controlled to align with the sidewalls of the nitride spacers 25, but as indicated with the dashed lines, the size and extent of the silicide layers 27 can vary from being aligned with the transistor stack sidewall, and can extend or protrude outwardly (as shown) or be recessed with respect to the transistor stack sidewall.

Figure 6:
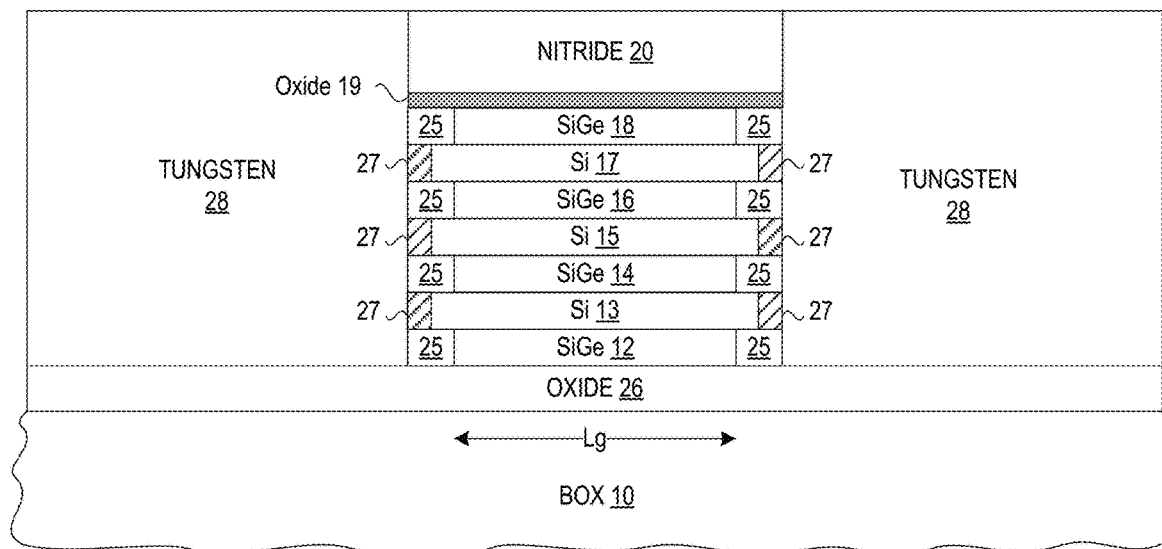
FIG. 6 illustrates processing of the semiconductor structure subsequent to FIG. 5 after forming planarized metal source/drain structures adjacent to the transistor stack and in contact with the silicide source/drain contact layers.

FIG. 6 illustrates processing of the semiconductor structure subsequent to FIG. 5 after forming planarized metal source/drain structures 28 adjacent to the transistor stack and in contact with the silicide source/drain contact layers 27. While any suitable source/drain fabrication sequence may be used, the source/drain structures 28 may be formed by depositing an initial seed layer over the semiconductor structure and then depositing one or more conductive layers (e.g., Tungsten), alone or in combination with barrier metal or liner layers, to cover the transistor stack 12-20 and adjacent regions with a thickness that is at least as tall as the transistor stack 12-20. In addition, one or more etch or polish steps may be applied to planarize the top surface of the metal source/drain structures 28 to be level with the top of the transistor stack 12-20.

Figure 7:
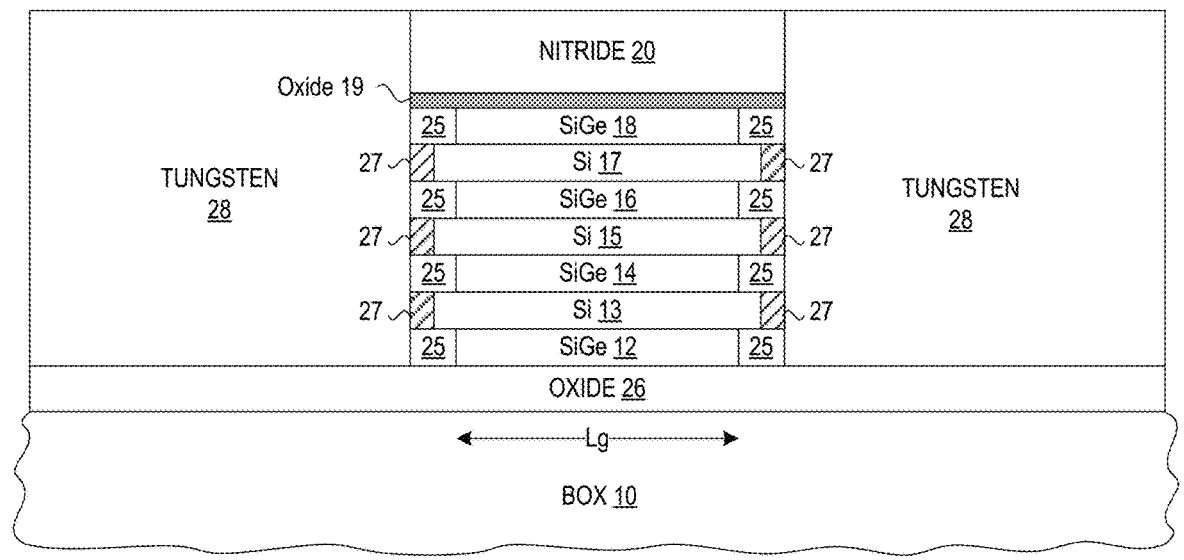
FIG. 7 illustrates processing of the semiconductor structure subsequent to FIG. 6 after the transistor stack is patterned and etched to expose the SiGe layers in the transistor stack.

FIG. 7 illustrates processing of the semiconductor structure subsequent to FIG. 6 after the transistor stack is patterned and etched with an active photo/etch and SiGe access process 29 to expose the SiGe layers in the transistor stack to a subsequent SiGe etch process. While the depicted cross-sectional drawing does not show etch openings that expose the SiGe layers 12, 14, 16, 18, it will be appreciated that the etch openings may be formed in the z-axis plane (in and out of the paper) to expose peripheral ends of the SiGe layers 12, 14, 16, 18. Though not shown, it will be appreciated that the photo/etch and SiGe access process 29 could also be used to form an etch opening which cuts the planarized metal source/drain structures 28 into separate source/drain regions. Alternatively, a separate photo/etch process could be used to form an etch opening which cuts the planarized metal source/drain structures 28 into separate source/drain regions prior to performing the SiGe access photo/etch. While any suitable pattern and etch process may be used, the active photo/etch and SiGe access process 29 may include forming a patterned mask (not shown) over the semiconductor structure by depositing, patterning, etching or developing a photoresist or hard mask layer on the transistor stack 12-20 and planarized metal source/drain structures 28. With the openings formed in the patterned photoresist/hard mask, the active photo/etch and SiGe access process 29 may also include one or more etch processes that are applied to create SiGe access openings in at least the transistor stack 12-20 which expose at least the SiGe layers 12, 14, 16, 18. The etch processing can include performing a sequence of reactive-ion etching (RIE) steps having suitable etch chemistry properties to remove, in sequence, the exposed portions of the protective nitride layer 20, oxide layer 19, and underlying layers of the transistor stack 12-18.

Figure 8:
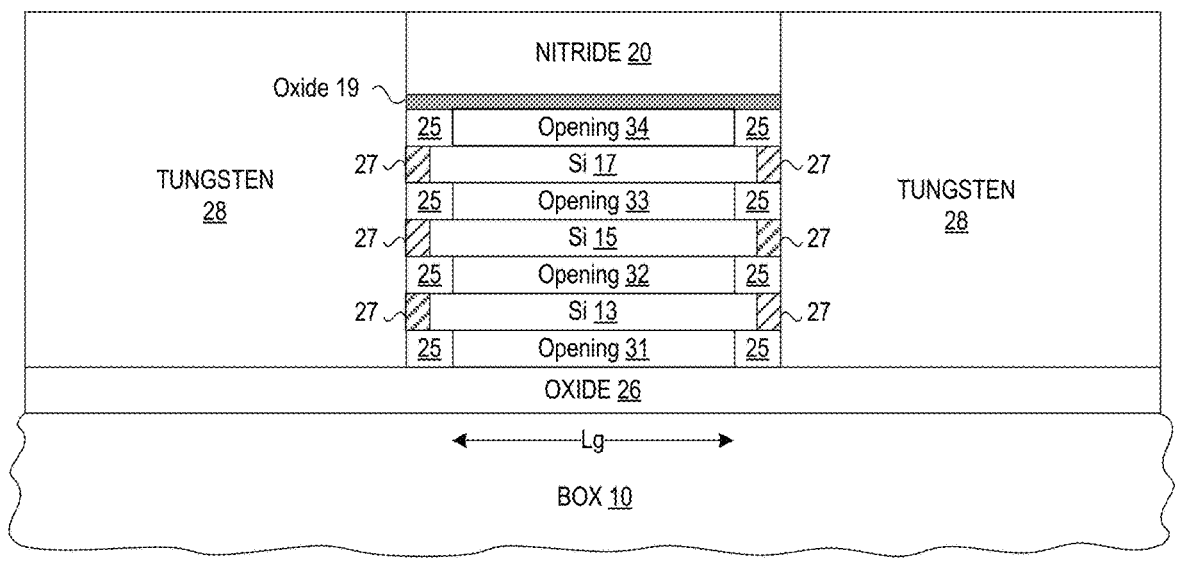
FIG. 8 illustrates processing of the semiconductor structure subsequent to FIG. 7 after selectively etching exposed SiGe layers to form gate openings in the transistor stack.

FIG. 8 illustrates processing of the semiconductor structure subsequent to FIG. 7 after applying a SiGe etch process 30 to selectively etch exposed SiGe layers 12, 14, 16, 18 to form gate openings 31, 32, 33, 34 in the transistor stack. While any suitable SiGe etch process may be used, a selective isotropic SiGe etch process 30, such as a timed isotropic dry etch, may be used to remove the exposed remnant SiGe layers 12, 14, 16, 18 from the transistor stack. At the conclusion of the SiGe etching process 30, the remnant SiGe portions 12, 14, 16, 18 of the transistor stack are replaced by gate openings 31-34 where the gate electrodes for the nanosheet transistors will be formed in the transistor stack.

Figure 9:
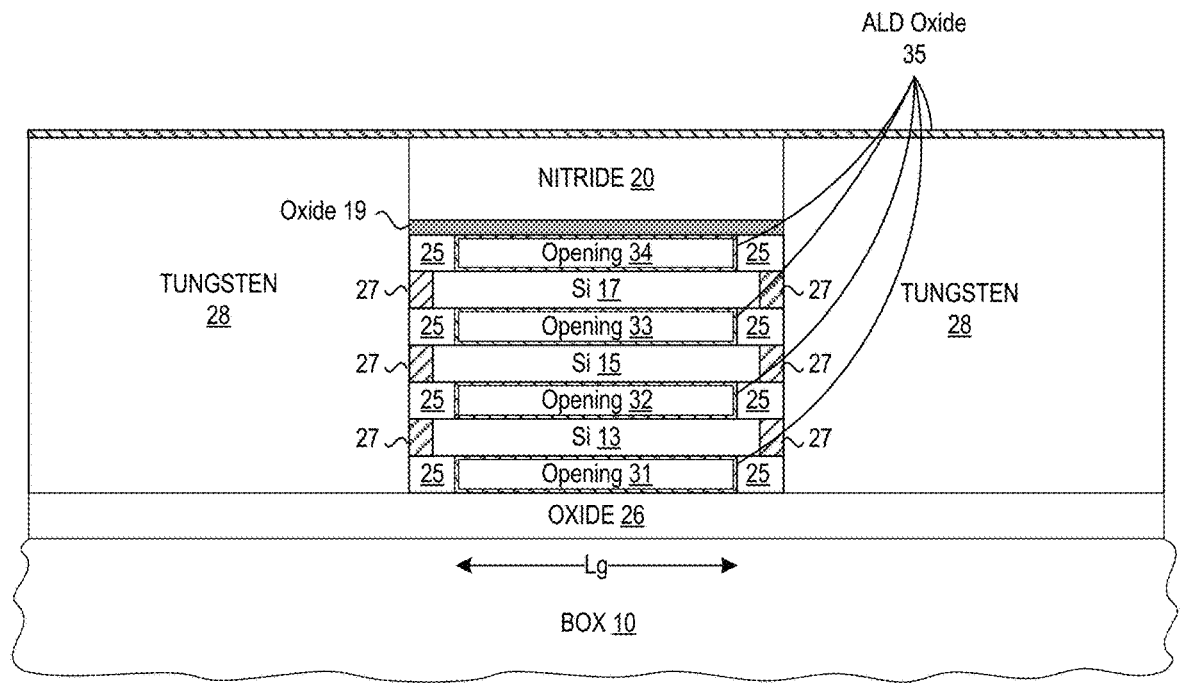
FIG. 9 illustrates processing of the semiconductor structure subsequent to FIG. 8 after an atomic layer deposition (ALD) oxide layer is formed as a liner layer in at least the gate openings of the transistor stack.

FIG. 9 illustrates processing of the semiconductor structure subsequent to FIG. 8 after a conformal gate dielectric layer 35 is formed as a liner layer in at least the gate openings 31-34 of the transistor stack. In selected embodiments, the conformal gate dielectric layer 35 is formed with an ALD process to conformally deposit an ALD oxide layer 35 to a desired gate dielectric thickness (e.g., 5-50 Angstroms) on the interior surfaces of the gate openings 31-34 without completely filling the gate openings. In selected embodiments, the ALD oxide deposition process may by implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. As a result, the ALD oxide deposition process offers accurate control of film thickness and composition as well as the ability to achieve excellent uniformity over large areas at relatively low temperatures. In addition to forming gate dielectric layers in the gate openings 31-34, the resulting ALD oxide 35 forms a substantially conformal layer over the upper surface of the semiconductor structure.

Figure 10:
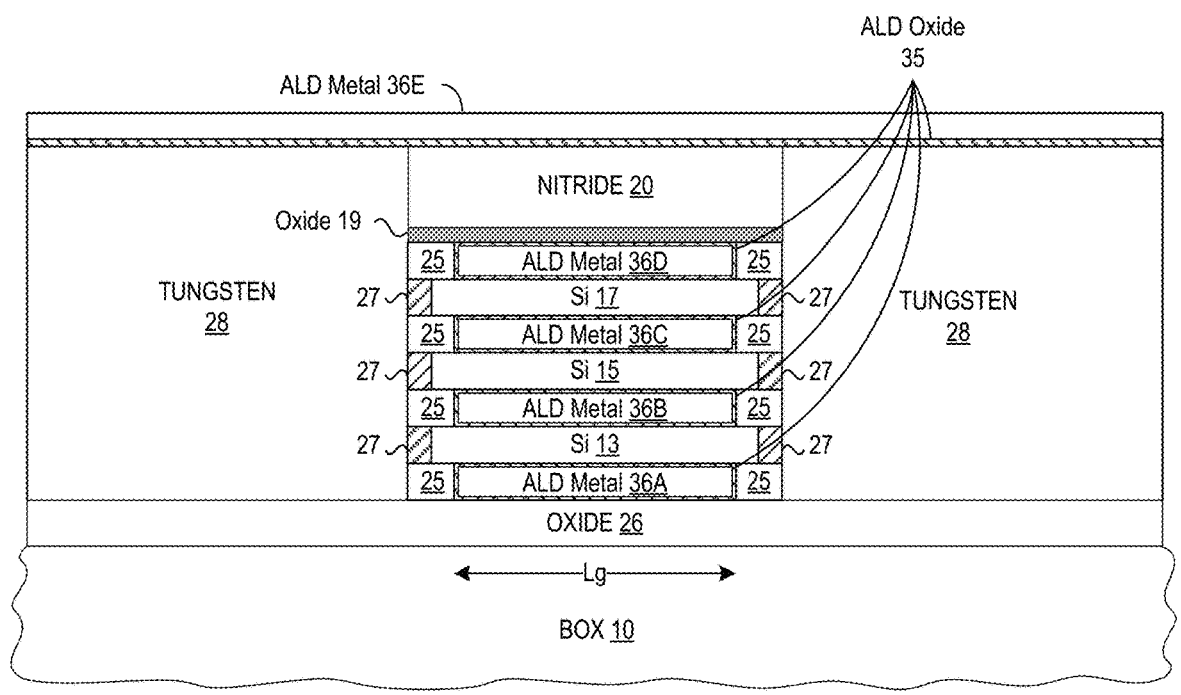
FIG. 10 illustrates processing of the semiconductor structure subsequent to FIG. 9 after an ALD metal layer is formed as a liner layer to at least fill the gate openings of the transistor stack.

FIG. 10 illustrates processing of the semiconductor structure subsequent to FIG. 9 after an ALD metal layer 36 is formed as a liner layer to at least fill the remaining gate openings 31-34 of the transistor stack. In selected embodiments, the conductive gate electrode layer(s) 36 are formed with an ALD process to conformally deposit at least a first ALD metal layer 36A-E on the ALD oxide layers 35 to at least partially fill the remaining gate openings 31-34. In selected embodiments, the ALD metal deposition process may by implemented by exposing the semiconductor structure to a precursor, evacuating or purging the precursors as well as byproducts from the chamber, exposing the semiconductor structure to reactant species (e.g., metals or other reagents), and evacuating or purging the reactants and byproduct molecules from the chamber. In addition to forming gate electrode layers 36A-D in the gate openings 31-34, the ALD metal process forms an ALD metal layer 36E as a substantially conformal layer over the upper surface of the semiconductor structure.

Figure 11:
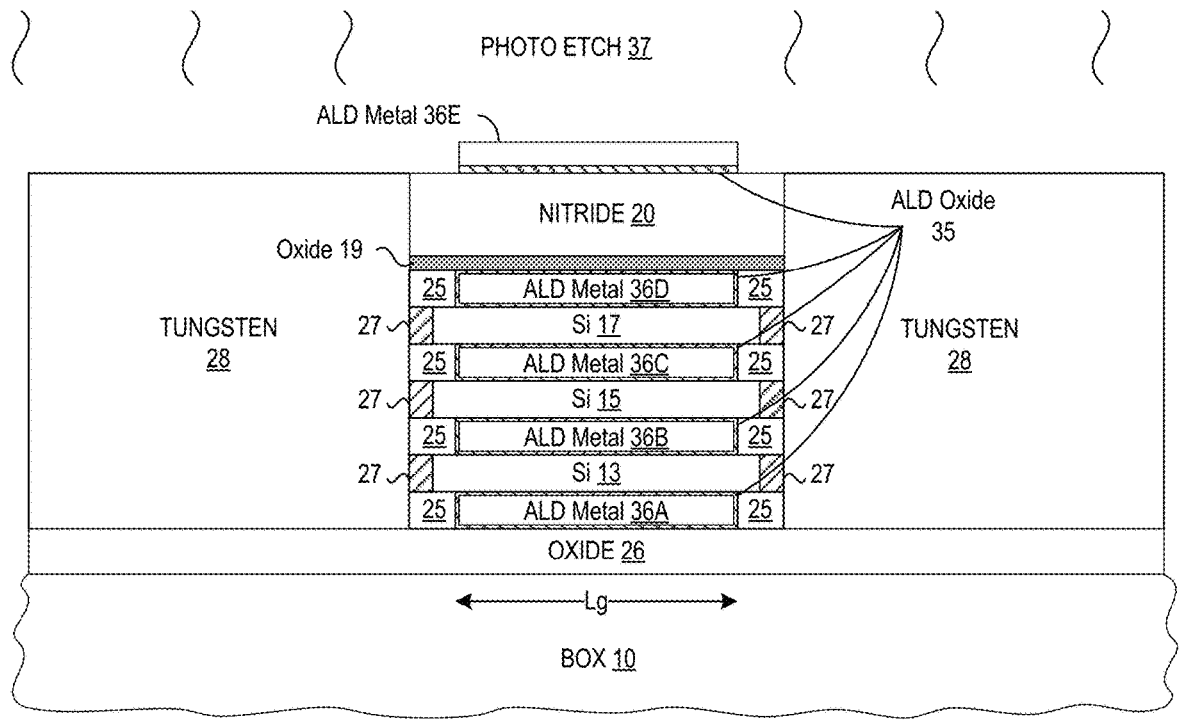
FIG. 11 illustrates processing of the semiconductor structure subsequent to FIG. 10 after a photo etch process is applied to the ALD metal layer and ALD oxide layer to form a gate electrode on the transistor stack.

FIG. 11 illustrates processing of the semiconductor structure subsequent to FIG. 10 after a photo etch process 37 is applied to form a gate electrode on the transistor stack by selectively etching the ALD metal layer and ALD oxide layer. While any suitable photo etch process may be used, the etch processing 37 can include forming a patterned photoresist layer or etch mask (not shown) to protect the gate stack layers formed on the transistor stack against one or more directional etching steps (e.g., RIE) having suitable etch chemistry properties to remove the ALD metal layer 36E from the surface of the semiconductor structure while leaving the underlying ALD oxide layer 35 on the surface of the transistor stack. The etch processing 37 can also include one or more isotropic and/or anisotropic oxide etching steps (e.g., RIE) having suitable etch chemistry properties to remove the ALD oxide layer 35 from the surface of the semiconductor structure while leaving the underlying gate electrodes 36A-D and gate dielectric layers 35 of the transistor stack in place. While the sidewalls of the protective oxide layer 19 are shown as being substantially vertical, minor deviations in the sidewall profile may occur due to etch processing variations caused by any oxide etches used in the photo etch process 37.

Figure 12:
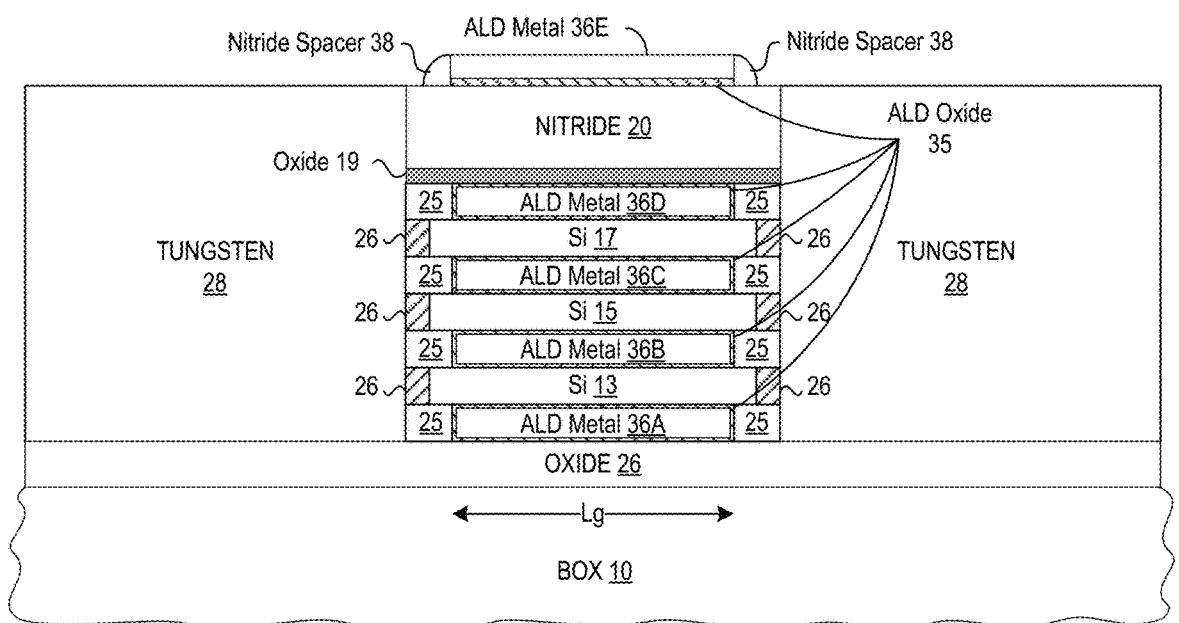
FIG. 12 illustrates processing of the semiconductor structure subsequent to FIG. 11 after forming nitride sidewall spacers adjacent to the gate electrode formed on the transistor stack.

FIG. 12 illustrates processing of the semiconductor structure subsequent to FIG. 11 after forming sidewall spacers 38 adjacent to the gate electrode formed on the transistor stack. While any suitable spacer formation sequence may be used, the sidewall spacers 38 may be formed by depositing one or more dielectric layers, such as a nitride layer, over the semiconductor structure to conformally cover the gate electrode and planarized metal source/drain structures 28, and then applying an anisotropic etch process to remove the dielectric layer(s) from the top surfaces of the transistor stack and planarized metal source/drain structures 28 but leaving remnant sidewall spacers 27 at the sides of the gate electrode.

At the process stage shown in FIG. 12, the fabrication of the nanosheet transistors in the transistor stack is complete except for any additional contact formation or back-end of line steps to provide external contacts to the gate, source and drain regions. As shown, the depicted transistor stack includes a first nanosheet transistor including the first silicon channel region 17 under control of a gate electrode 36C, 36D, a second nanosheet transistor including the second silicon channel region 15 under control of a gate electrode 36C, 36B, and a third nanosheet transistor including the third silicon channel region 13 under control of a gate electrode 36B, 36A. As illustrated, the nanosheet FET transistor is formed with low-resistance source/drain regions which include silicide source/drain channel sidewalls 26 formed on exposed silicon nanosheet channel layers 13, 15, 17 of the transistor stack and in direct electrical contact with planarized tungsten source/drain regions 28. However, as will be appreciated, the formation of the silicide source/drain channel sidewalls 26 may not provide the optimal silicon channel strain engineering benefits that would otherwise be obtained by forming the source/drain regions with an epitaxial semiconductor formation process.

Figure 13:
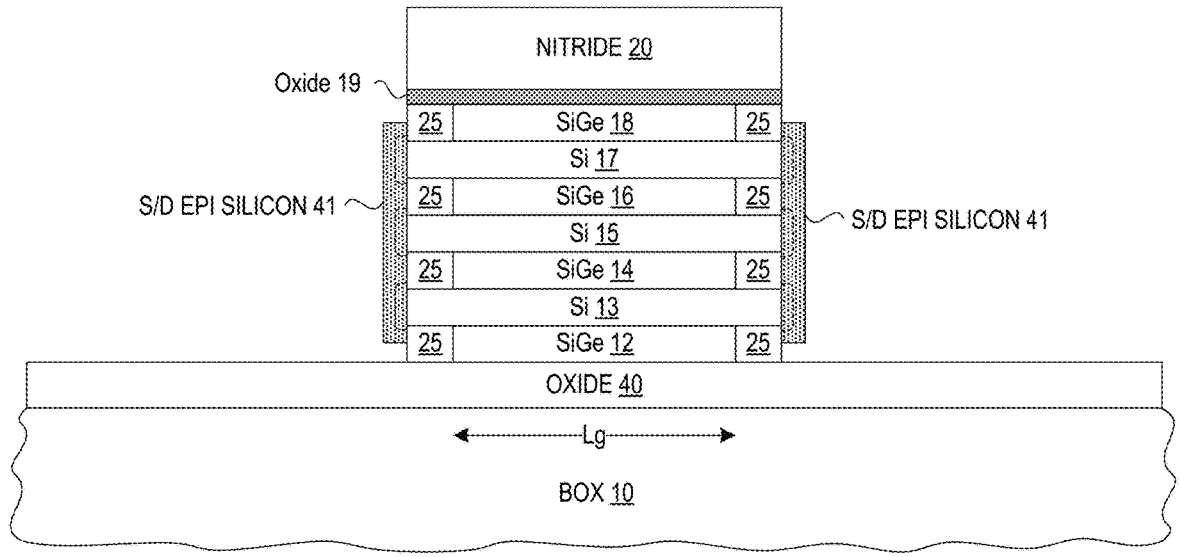
FIG. 13 is a partial cross-sectional view of a semiconductor structure subsequent to FIG. 4 after forming a replacement oxide layer at the bottom of the transistor stack and forming epitaxial source/drain regions on exposed sidewalls of the silicon layers in the transistor stack in accordance with selected second embodiments of the present disclosure.

To provide a further improvement in the fabrication of stacked nanosheet FET devices by including silicon channel strain engineering benefits, reference is now made to FIG. 13 which depicts a partial cross-sectional view of a semiconductor structure subsequent to FIG. 4 after forming a replacement oxide layer 40 at the bottom of the transistor stack 12-20 and forming epitaxial silicon source/drain regions 41 on exposed sidewalls of the silicon nanosheet layers 13, 15, 17 in the transistor stack 12-20. As disclosed herein, any suitable process may be used to form the replacement oxide layer 40, such as by forming a patterned photoresist layer or etch mask (not shown) which exposes the bottom silicon nanosheet layer 11 so that a suitable lateral silicon etch (e.g., isotropic silicon wet etch) is applied to remove the bottom silicon nanosheet layer 11 except for stack ends in the width dimension (e.g., perpendicular to the gate length dimension) that remain to support the transistor stack 12-20. After etching the bottom silicon nanosheet layer 11, the resulting opening is filled with one or more oxide layers to form the replacement oxide layer 40, such as by using one or more conformal CVD oxide layers to fill the opening and form the replacement oxide layer 40. Subsequently, the remnant stack ends of the bottom silicon nanosheet layer 11 can be etched away in subsequent processing.

After forming the replacement oxide layer 40, epitaxial silicon source/drain regions 41 are formed on exposed sidewalls of the silicon nanosheet layers 13, 15, 17 in the transistor stack 12-20 by epitaxially growing and doping source/drain regions 41 adjacent to the transistor stack. While any suitable epitaxial semiconductor formation process may be used, the epitaxial silicon source/drain regions 41 may be formed by using the silicon nanosheet layers 13, 15, 17 to epitaxially grow or deposit the source/drain epitaxial silicon layers 41 in the regions adjacent to the transistor stack. As will be appreciated, by epitaxially growing the epitaxial silicon source/drain regions 41, the silicon nanosheet layers 13, 15, 17 are subjected to compressive stress from the epitaxial growth process. At this point, the epitaxial silicon source/drain regions 41 can be doped using any suitable doping technique. For example, the epitaxial silicon source/drain regions 41 may be in-situ doped during the epi process, such as by doping epitaxially grown source/drain features with boron, arsenic and/or phosphorus to form doped epitaxial silicon source/drain regions 41. As will be appreciated, the doping dose used to dope the epitaxial silicon source/drain regions 41 is greater than a doping dose (if any) used to dope the channel regions in the silicon layers 13, 15, 17. In some embodiments, after formation of the epitaxial silicon source/drain regions 41, an epi anneal process may be performed to promote formation of crystalline structures in the epitaxial silicon source/drain regions 41, such as by applying a high thermal budget process. The depicted thickness of the epitaxial silicon source/drain regions 41 is shown as being a uniform thickness down the sidewalls of the transistor stack, but as indicated with the dashed lines, the size and extent of the source/drain epitaxial silicon layers 41 can vary from being a uniform thickness, and can extend or protrude outwardly with respect to the transistor stack sidewall.

Figure 14:
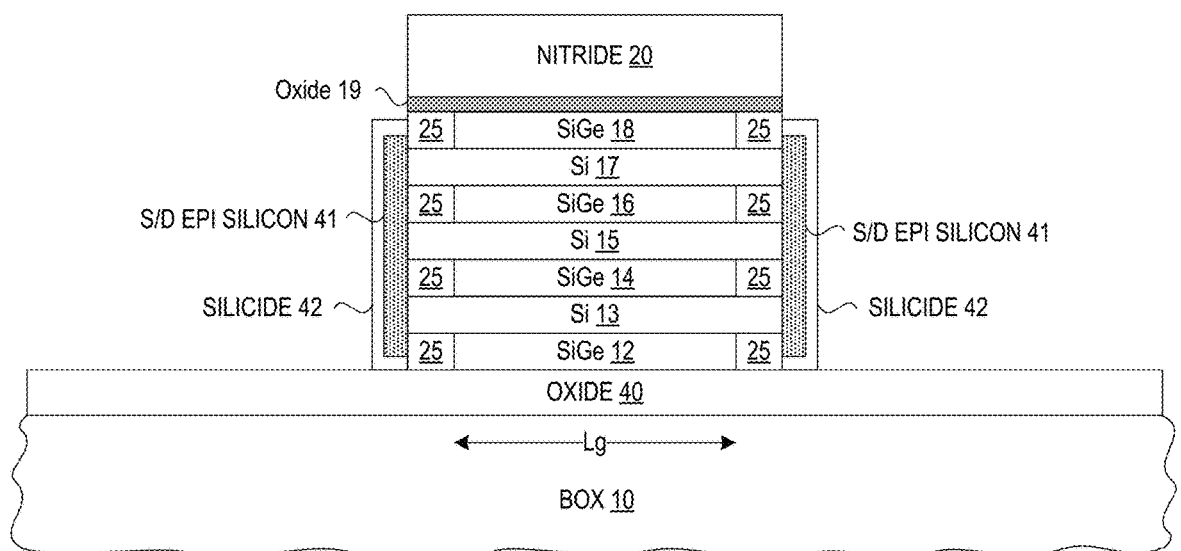
FIG. 14 illustrates processing of the semiconductor structure subsequent to FIG. 13 after forming silicide source/drain contact layers on the epitaxial source/drain regions.

FIG. 14 illustrates processing of the semiconductor structure subsequent to FIG. 13 after forming silicide source/drain contact layers 42 on the source/drain epitaxial silicon regions 41 to facilitate electrical connection between the silicon nanosheet channel layers 13, 15, 17 and the subsequently-formed source/drain regions. While any desired silicide formation process may be used to form the silicide layers 42 (such as $CoSi_2$ or NiSi), an example silicide formation sequence would be to deposit or sputter a conductive or metal layer (e.g., cobalt or nickel) over the semiconductor structure, followed by a heating step to react the metal layer with the exposed source/drain epitaxial silicon layers 41 to form silicide layers 42. In an illustrative embodiment, the reaction of the metal layer and the source/drain epitaxial silicon layers 41 is promoted by performing an initial rapid thermal anneal step (e.g., 400-600° C.), followed by a Piranha clean step to remove excess metal, and then followed by a second rapid thermal anneal step (e.g., 650-850° C.). The timing and temperature of the initial rapid thermal anneal step are selected so that the metal layer reacts with the exposed surfaces of the source/drain epitaxial silicon layers 41. After the Piranha clean step, the timing and temperature of the second rapid thermal anneal step are selected so that the reacted silicide layer 42 is pushed into a low resistivity phase.

Figure 15:
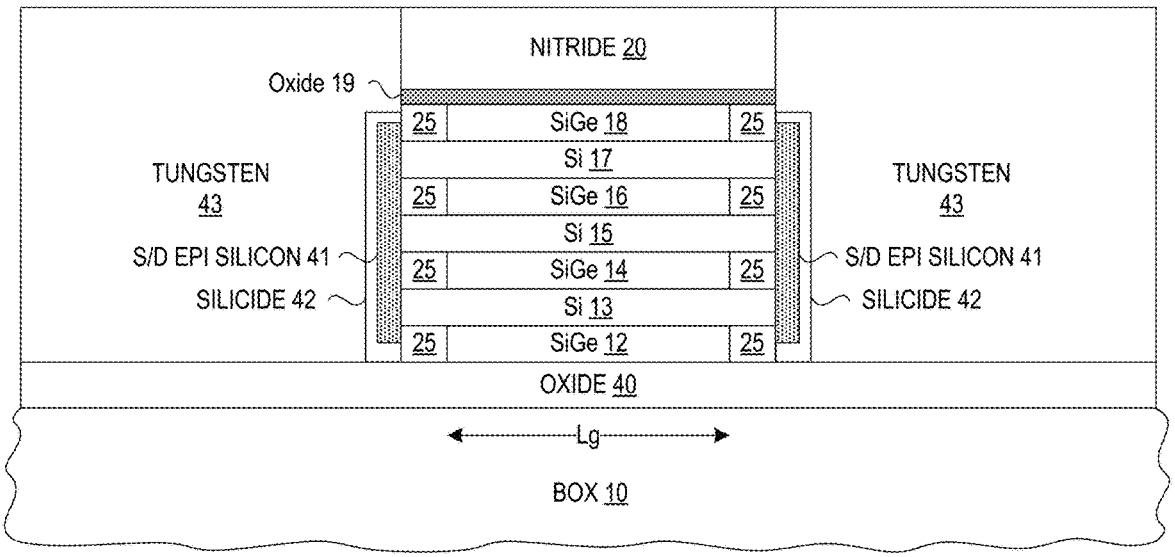
FIG. 15 illustrates processing of the semiconductor structure subsequent to FIG. 14 after forming planarized metal source/drain structures adjacent to the transistor stack and in contact with the silicide source/drain contact layers.

FIG. 15 illustrates processing of the semiconductor structure subsequent to FIG. 14 after forming planarized metal source/drain structures 43 adjacent to the transistor stack and in contact with the silicide source/drain contact layers 42. While any suitable source/drain fabrication sequence may be used, the source/drain structures 43 may be formed by depositing an initial seed layer over the semiconductor structure and then depositing one or more conductive layers (e.g., Tungsten), alone or in combination with barrier metal or liner layers, to cover the transistor stack 12-20 and adjacent regions with a thickness that is at least as tall as the transistor stack 12-20. In addition, one or more etch or polish steps may be applied to planarize the top surface of the metal source/drain structures 28 to be level with the top of the transistor stack 12-20.

At the process stage shown in FIG. 15, the fabrication of the source/drain regions for the nanosheet transistor is complete; however, the gate electrodes have not been formed in the transistor stack. As will be appreciated, any suitable gate electrode stack formation sequence, such as the sequence depicted in FIGS. 7-12, can be used to form gate electrodes in the transistor stack which surround the silicon channel regions 13, 15, 17 under control of the gate electrode. As a result, the nanosheet FET transistor is formed with low-resistance source/drain regions which include source/drain epitaxial silicon layers 41 formed on the exposed silicon nanosheet channel layers 13, 15, 17 of the transistor stack, silicide source/drain channel sidewalls 42 formed on the source/drain epitaxial silicon layers 41, and planarized tungsten source/drain regions 43 in direct electrical contact with the silicide source/drain channel sidewalls 42. While the formation of the source/drain epitaxial silicon layers 41 will provide some silicon channel strain engineering benefits to the nanosheet FET device, the channel strain engineering benefits may be less than would otherwise be obtained by forming the source/drain regions with an epitaxial semiconductor formation process.

Figure 16:
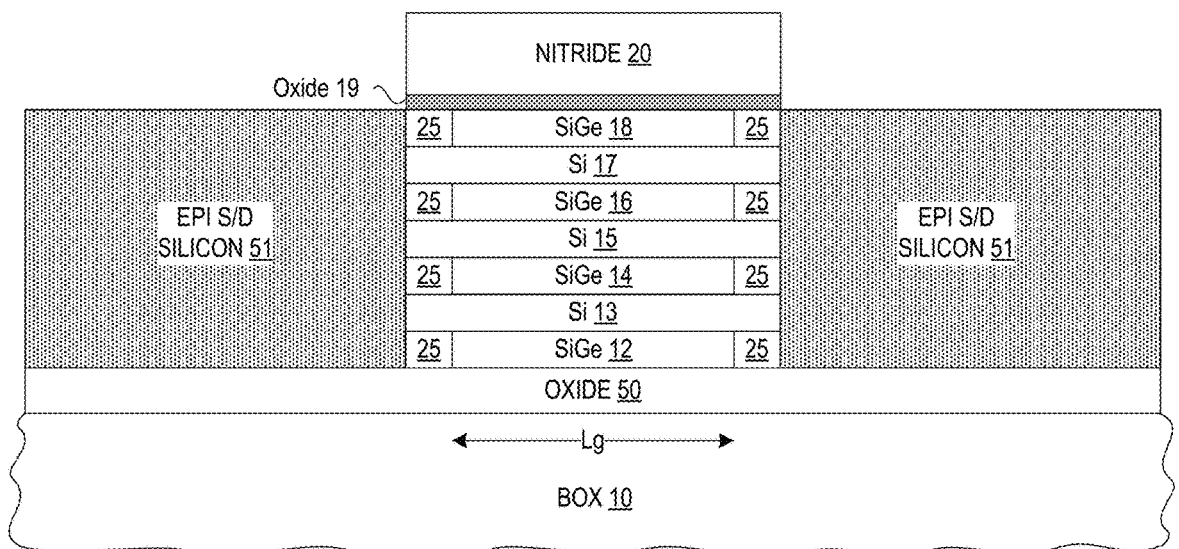
FIG. 16 is a partial cross-sectional view of a semiconductor structure subsequent to FIG. 4 after forming a replacement oxide layer at the bottom of the transistor stack and forming planarized epitaxial source/drain regions adjacent to the transistor stack in accordance with selected third embodiments of the present disclosure.

To provide a further improvement in the fabrication of stacked nanosheet FET devices by including silicon channel strain engineering benefits, reference is now made to FIG. 16 which depicts a partial cross-sectional view of a semiconductor structure subsequent to FIG. 4 after forming a replacement oxide layer 50 at the bottom of the transistor stack 12-20 and forming epitaxial source/drain regions 51 adjacent to the transistor stack 12-20. As disclosed herein, any suitable process may be used to form the replacement oxide layer 50, such as by forming a patterned photoresist layer or etch mask (not shown) which exposes the bottom silicon nanosheet layer 11 so that a suitable lateral silicon etch (e.g., isotropic silicon wet etch) is applied to remove the bottom silicon nanosheet layer 11 except for stack ends in the width dimension (e.g., perpendicular to the gate length dimension) that remain to support the transistor stack 12-20. After etching the bottom silicon nanosheet layer 11, the resulting opening is filled with one or more oxide layers to form the replacement oxide layer 40, such as by using one or more conformal CVD oxide layers to fill the opening and form the replacement oxide layer 40. Subsequently, the remnant stack ends of the bottom silicon nanosheet layer 11 can be etched away in subsequent processing.

After forming the replacement oxide layer 50, epitaxial silicon source/drain regions 51 are formed on exposed sidewalls of the silicon nanosheet layers 13, 15, 17 in the transistor stack 12-20 by epitaxially growing and doping or implanting source/drain regions 51 adjacent to the transistor stack. While any suitable epitaxial semiconductor formation process may be used, the epitaxial silicon source/drain regions 51 may be formed by using the silicon nanosheet layers 13, 15, 17 to epitaxially grow or deposit the source/drain epitaxial silicon layers 51 in the regions adjacent to the transistor stack. As will be appreciated, by epitaxially growing the epitaxial silicon source/drain regions 51, the silicon nanosheet layers 13, 15, 17 are subjected to compressive stress from the epitaxial growth process. At this point, the epitaxial silicon source/drain regions 51 can be doped using any suitable doping technique. For example, the epitaxial silicon source/drain regions 51 may be in-situ doped during the epi process, such as by doping epitaxially grown source/drain features with boron, arsenic and/or phosphorus to form doped epitaxial silicon source/drain regions 51. In some embodiments, the source/drain features are not in-situ doped, and instead an implantation process is performed to dope the epitaxial source/drain regions 51. As will be appreciated, the doping dose used to dope the epitaxial silicon source/drain regions 51 is greater than a doping dose (if any) used to dope the channel regions in the silicon layers 13, 15, 17. In some embodiments, after formation of the epitaxial silicon source/drain regions 51, an epi anneal process may be performed to promote formation of crystalline structures in the epitaxial silicon source/drain regions 51, such as by applying a high thermal budget process. If desired, a planarization process (e.g., CMP) or selective etch process may be applied to form the epitaxial silicon source/drain regions 51 with a uniform planar thickness that extends up to the protective oxide layer 19 of the epitaxial silicon source/drain regions 41. However, it will be appreciated that the epitaxial silicon source/drain regions 51 may be planarized with respect to the upper surface of the protective nitride layer 20, or may have a non-uniform thickness over the intended source/drain regions, though the extent and size of the epitaxial silicon source/drain regions 51 should be controlled to provide a desired amount of compressive stress to the silicon nanosheet layers 13, 15, 17 during the epitaxial growth process.

Figure 17:
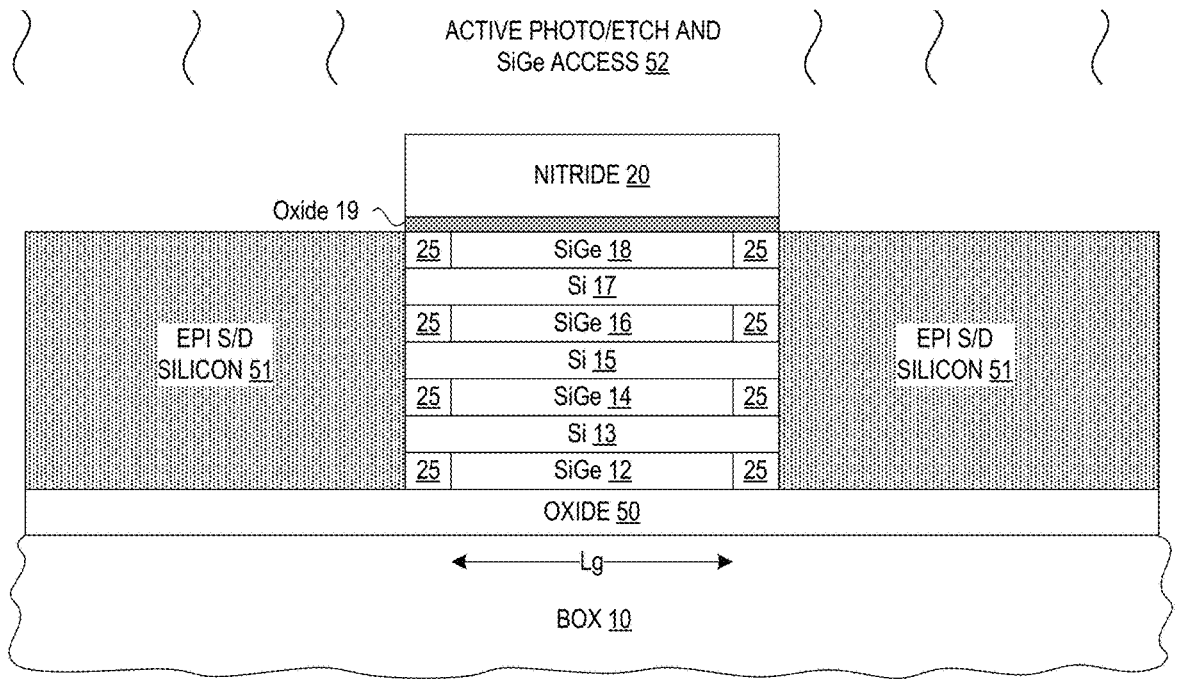
FIG. 17 illustrates processing of the semiconductor structure subsequent to FIG. 16 after the transistor stack is patterned and etched to expose the SiGe layers in the transistor stack.

FIG. 17 illustrates processing of the semiconductor structure subsequent to FIG. 16 after the transistor stack is patterned and etched with an active photo/etch and SiGe access process 52 to expose the SiGe layers 12, 14, 16, 18 in the transistor stack to a subsequent SiGe etch process. While the depicted cross-sectional drawing does not show etch openings that expose the SiGe layers 12, 14, 16, 18, it will be appreciated that the etch openings may be formed in the z-axis plane (in and out of the paper) to expose peripheral ends of the SiGe layers 12, 14, 16, 18. Though not shown, it will be appreciated that the photo/etch and SiGe access process 52 could also be used to form an etch opening which cuts the epitaxial silicon source/drain regions 51 into separate source/drain regions. While any suitable pattern and etch process may be used, the active photo/etch and SiGe access process 52 may include forming a patterned mask (not shown) over the semiconductor structure by depositing, patterning, etching or developing a photoresist or hard mask layer on the transistor stack 12-20 and epitaxial silicon source/drain regions 51. With the openings formed in the patterned photoresist/hard mask, the active photo/etch and SiGe access process 52 may also include one or more etch processes that are applied to create SiGe access openings in at least the transistor stack 12-20 which expose at least the SiGe layers 12, 14, 16, 18. The etch processing can include performing a sequence of reactive-ion etching (RIE) steps having suitable etch chemistry properties to remove, in sequence, the exposed portions of the protective nitride layer 20, oxide layer 19, and underlying layers of the transistor stack 12-18.

Figure 18:
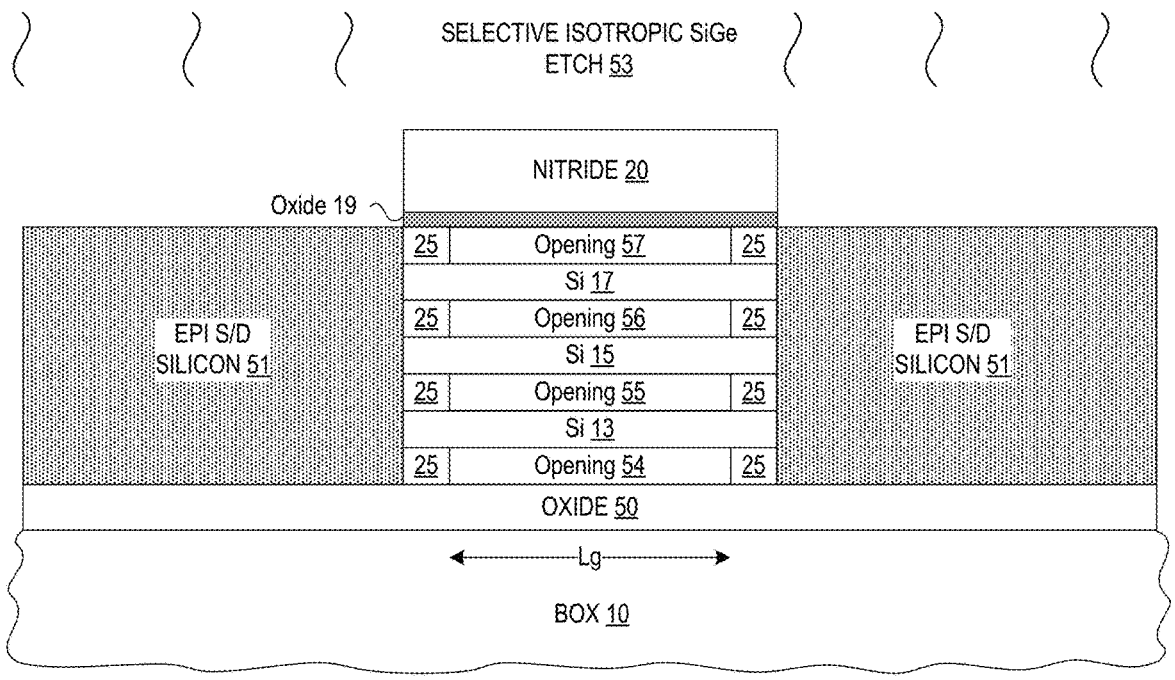
FIG. 18 illustrates processing of the semiconductor structure subsequent to FIG. 17 after selectively etching exposed SiGe layers to form gate openings in the transistor stack.

FIG. 18 illustrates processing of the semiconductor structure subsequent to FIG. 17 after applying a SiGe etch process 53 to selectively etch exposed SiGe layers 12, 14, 16, 18 to form gate openings 54, 55, 56, 57 in the transistor stack. While any suitable SiGe etch process may be used, a selective isotropic SiGe etch process 53, such as a timed isotropic dry etch, may be used to remove the exposed remnant SiGe layers 12, 14, 16, 18 from the transistor stack. At the conclusion of the SiGe etching process 53, the remnant SiGe portions 12, 14, 16, 18 of the transistor stack are replaced by gate openings 54-57 where the gate electrodes for the nanosheet transistors will be formed in the transistor stack.

Figure 19:
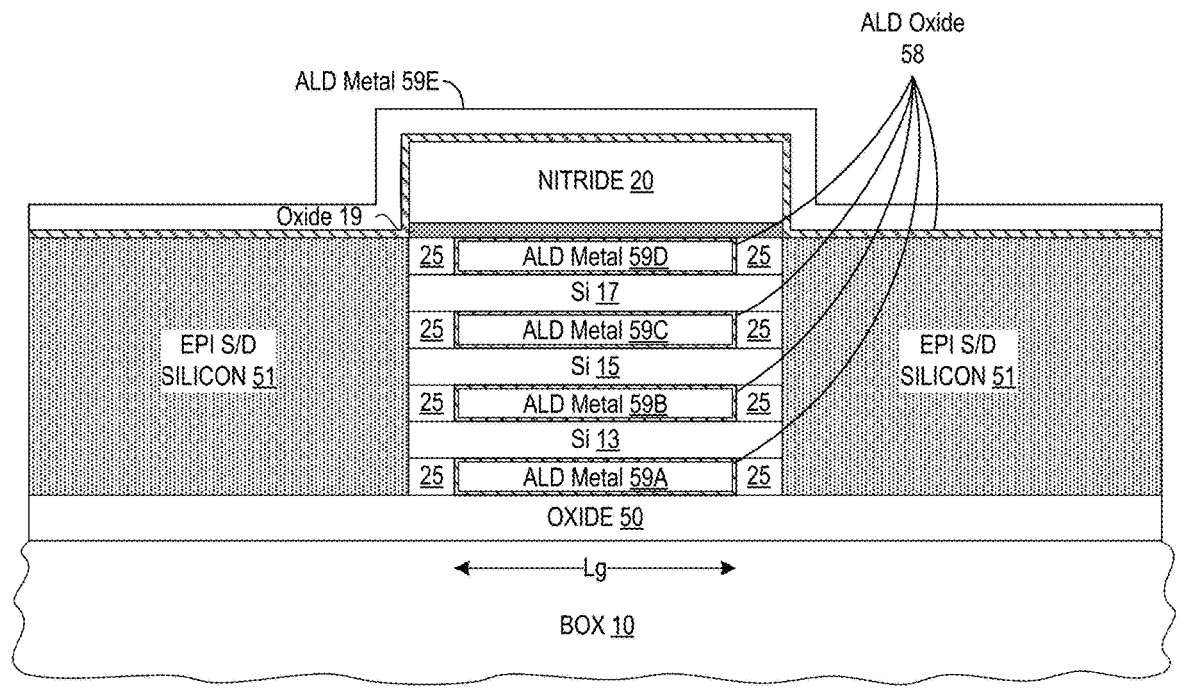
FIG. 19 illustrates processing of the semiconductor structure subsequent to FIG. 18 after sequentially forming an ALD oxide layer and ALD metal layer in at least the gate openings of the transistor stack.

FIG. 19 illustrates processing of the semiconductor structure subsequent to FIG. 18 after sequentially forming an ALD oxide layer 58 and ALD metal layer 59 in at least the gate openings 54-57 of the transistor stack. In selected embodiments, the conformal gate dielectric layer 58 is formed with an ALD to conformally deposit an ALD oxide layer 58 to a desired gate dielectric thickness (e.g., 5-50 Angstroms) on the interior surfaces of the gate openings 54-57 without completely filling the gate openings. In addition, the conductive gate electrode layer(s) 59 are formed with an ALD process to conformally deposit at least a first ALD metal layer 59A-E on the ALD oxide layers 58 to at least partially fill the remaining gate openings 54-57. In addition to forming gate dielectric and electrode layers in the gate openings 54-57, the ALD oxide and metal processes form an ALD oxide layer 58 and ALD metal layer 59E as a substantially conformal layer over the upper surface of the semiconductor structure.

Figure 20:
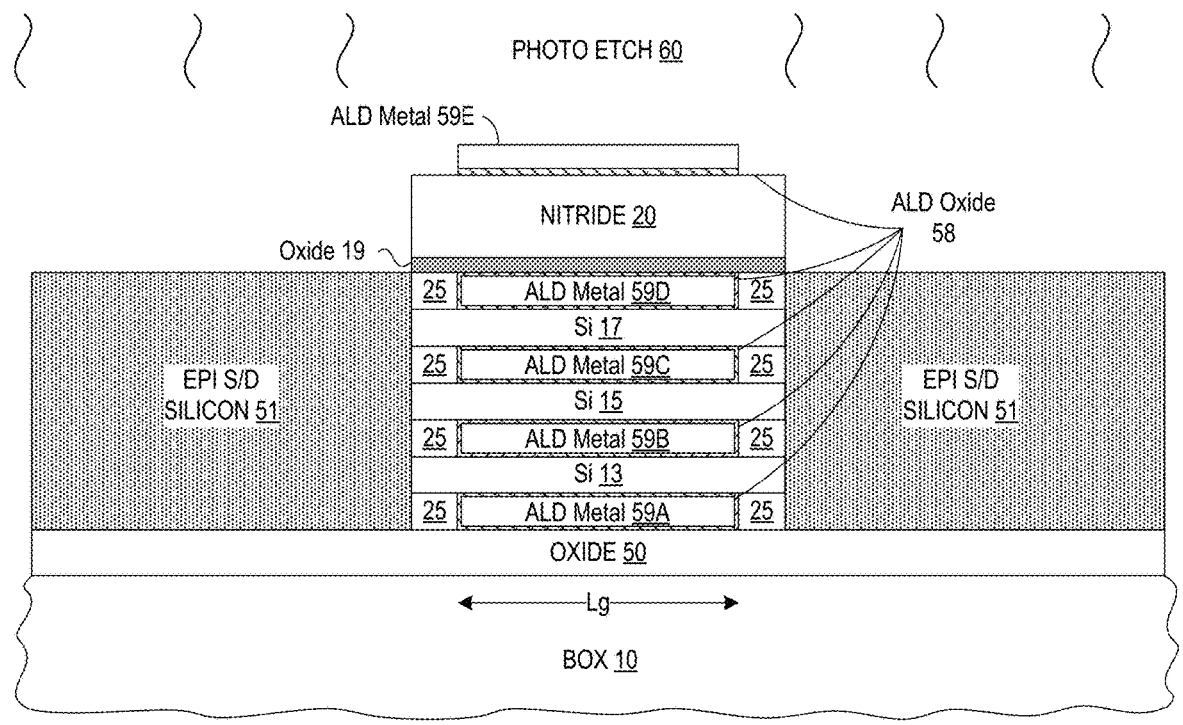
FIG. 20 illustrates processing of the semiconductor structure subsequent to FIG. 19 after a photo etch process is applied to the ALD metal layer and ALD oxide layer to form a gate electrode on the transistor stack.

FIG. 20 illustrates processing of the semiconductor structure subsequent to FIG. 19 after a photo etch process 60 is applied to form a gate electrode on the transistor stack by selectively etching the ALD metal layer 59E and ALD oxide layer 58. While any suitable photo etch process may be used, the etch processing 60 can include forming a patterned photoresist layer or etch mask (not shown) to protect the gate stack layers formed on the transistor stack against one or more directional etching steps (e.g., RIE) having suitable etch chemistry properties to remove the ALD metal layer 59E from the surface of the semiconductor structure while leaving the underlying ALD oxide layer 58 on the surface of the transistor stack. The etch processing 60 can also include one or more isotropic and/or anisotropic oxide etching steps (e.g., RIE) having suitable etch chemistry properties to remove the ALD oxide layer 58 from the surface of the semiconductor structure while leaving the underlying gate electrodes 59A-D and gate dielectric layers 58 of the transistor stack in place. While the sidewalls of the protective oxide layer 19 are shown as being substantially vertical, minor deviations in the sidewall profile may occur due to etch processing variations caused by any oxide etches used in the photo etch process 60.

Figure 21:
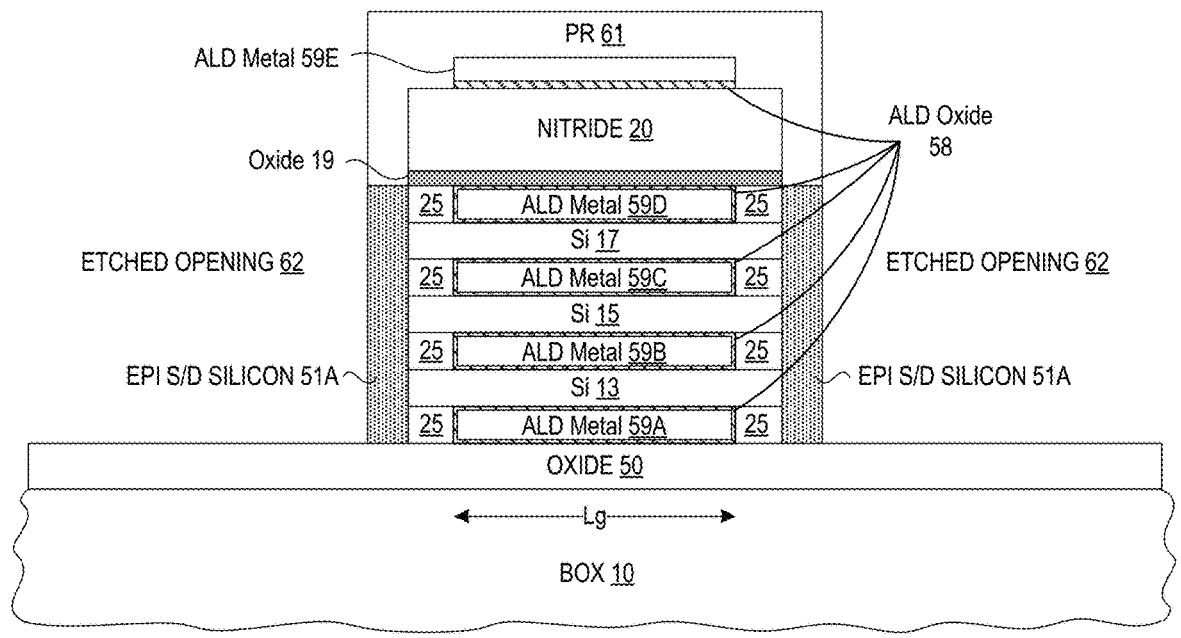
FIG. 21 illustrates processing of the semiconductor structure subsequent to FIG. 20 after applying a patterned etch process to the planarized epitaxial source/drain regions to form remnant epitaxial source/drain regions adjacent to the transistor stack.

FIG. 21 illustrates processing of the semiconductor structure subsequent to FIG. 20 after applying a photo etch process to the epitaxial source/drain regions 51 to form remnant epitaxial source/drain regions 51A adjacent to the transistor stack. While any suitable photo etch process may be used, the etch processing can include forming a patterned photoresist layer or etch mask 61 to protect the transistor stack (including the gate electrode stack layers 58-59) and adjacent portions of the epitaxial silicon source/drain regions 51 against one or more directional etching steps (e.g., RIE) having suitable etch chemistry properties to remove the outer portions of the epitaxial source/drain regions 51 from the surface of the semiconductor structure while leaving the remnant epitaxial source/drain regions 51A on the sidewalls of the transistor stack. The photo etch processing can include one or more isotropic and/or anisotropic oxide etching steps (e.g., RIE) having suitable etch chemistry properties to remove the unprotected outer portions of the epitaxial source/drain regions 51 from the surface of the semiconductor structure while leaving the transistor stack and remnant epitaxial source/drain regions 51A in place.

Figure 22:
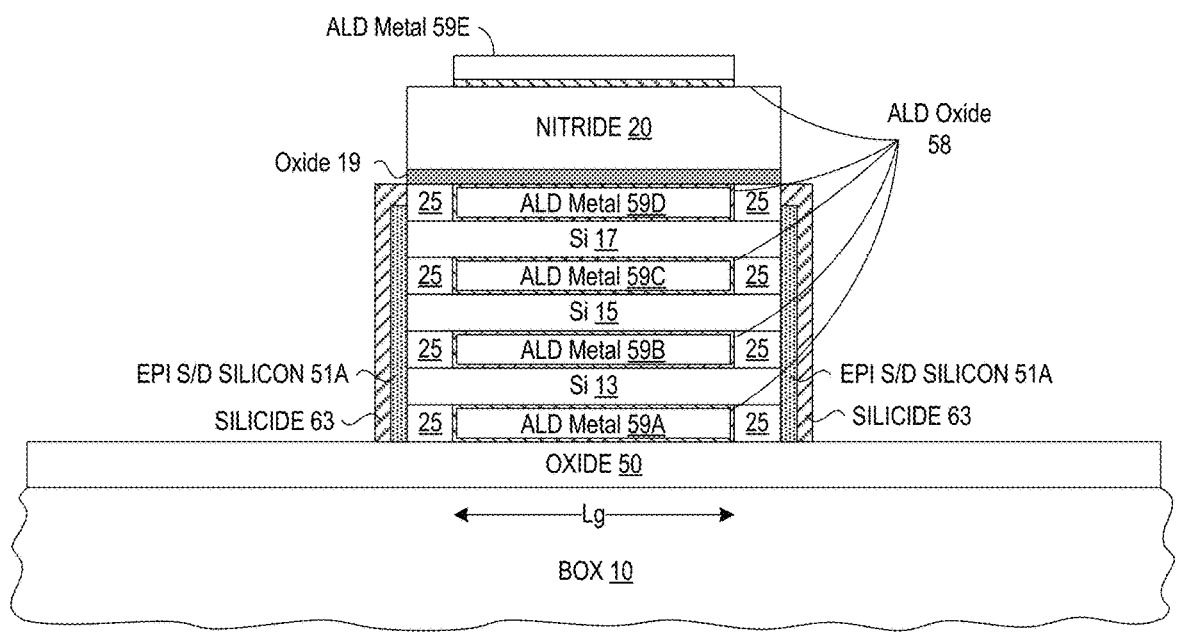
FIG. 22 illustrates processing of the semiconductor structure subsequent to FIG. 21 after forming silicide source/drain contact layers on the remnant epitaxial source/drain regions.

FIG. 22 illustrates processing of the semiconductor structure subsequent to FIG. 21 after forming silicide source/drain contact layers 63 on exposed sidewalls of the remnant epitaxial source/drain regions 51A. At the depicted processing stage, the etch mask 61 has been removed using any suitable stripping process. While any desired silicide formation process may be used to form the silicide layers 63 (such as $CoSi_2$ or NiSi), an example silicide formation sequence would be to deposit or sputter a conductive or metal layer (e.g., cobalt or nickel) over the semiconductor structure, followed by a heating step to react the metal layer with the exposed sidewalls of the remnant epitaxial source/drain regions 51A to form silicide layers 63. In the depicted example, the silicide layers 63 are formed by partially converting or consuming the remnant epitaxial source/drain regions 51A, but it will be appreciated that the silicide layers 63 may be formed on the surface of the remnant epitaxial source/drain regions 51A.

Figure 23:
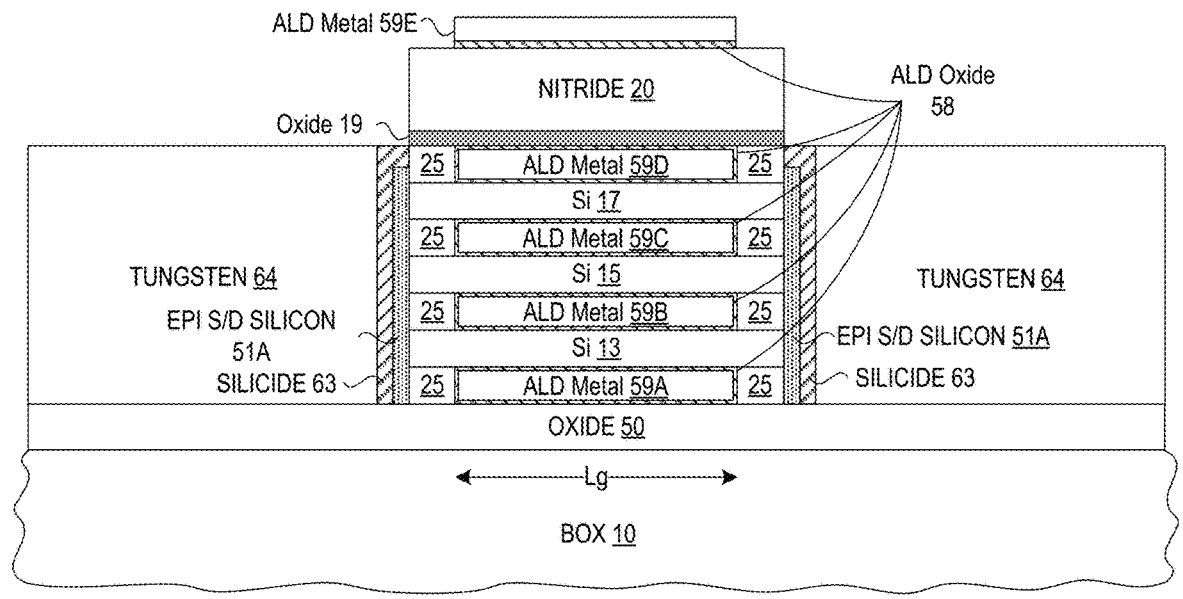
FIG. 23 illustrates processing of the semiconductor structure subsequent to FIG. 22 after forming planarized metal source/drain structures adjacent to the transistor stack and in contact with the silicide source/drain contact layers.

FIG. 23 illustrates processing of the semiconductor structure subsequent to FIG. 22 after forming planarized metal source/drain structures 64 adjacent to the transistor stack and in contact with the silicide source/drain contact layers 63. While any suitable source/drain fabrication sequence may be used, the source/drain structures 64 may be formed by depositing an initial seed layer over the semiconductor structure and then depositing one or more conductive layers (e.g., Tungsten), alone or in combination with barrier metal or liner layers, to cover the transistor stack and adjacent regions with a thickness that is at least as tall as the transistor stack. In addition, one or more etch or polish steps may be applied to planarize the top surface of the metal source/drain structures 64 to be level with the top of the transistor stack. For example, a metal etchback process may be applied to planarize the tungsten source/drain structures 64 with the top of the transistor stack.

At the process stage shown in FIG. 23, the fabrication of the source/drain regions for the nanosheet transistor is complete except for any additional contact formation or back-end of line steps to provide external contacts to the gate, source and drain regions. However, it will be appreciated that, after forming the epitaxial source/drain silicon regions 51, the source/drain formation steps (illustrated in FIGS. 21-23) can occur before forming the gate electrode stacks 58-59 (illustrated in FIGS. 17-20). In either case, the depicted transistor stack includes a first nanosheet transistor including the first silicon channel region 17 under control of a gate electrode 59C, 59D, a second nanosheet transistor including the second silicon channel region 15 under control of a gate electrode 59C, 59B, and a third nanosheet transistor including the third silicon channel region 13 under control of a gate electrode 59B, 59A. As illustrated, the nanosheet FET transistor is formed with low-resistance source/drain regions which include remnant epitaxial source/drain silicon layers 51A, silicide source/drain channel sidewalls 63, and planarized tungsten source/drain regions 64. In addition, the disclosed formation of the silicide source/drain channel sidewalls 63 after forming the epitaxial source/drain silicon regions 51 provides silicon channel strain engineering benefits to improve the performance of the final nanosheet FET device.

Figure 24:
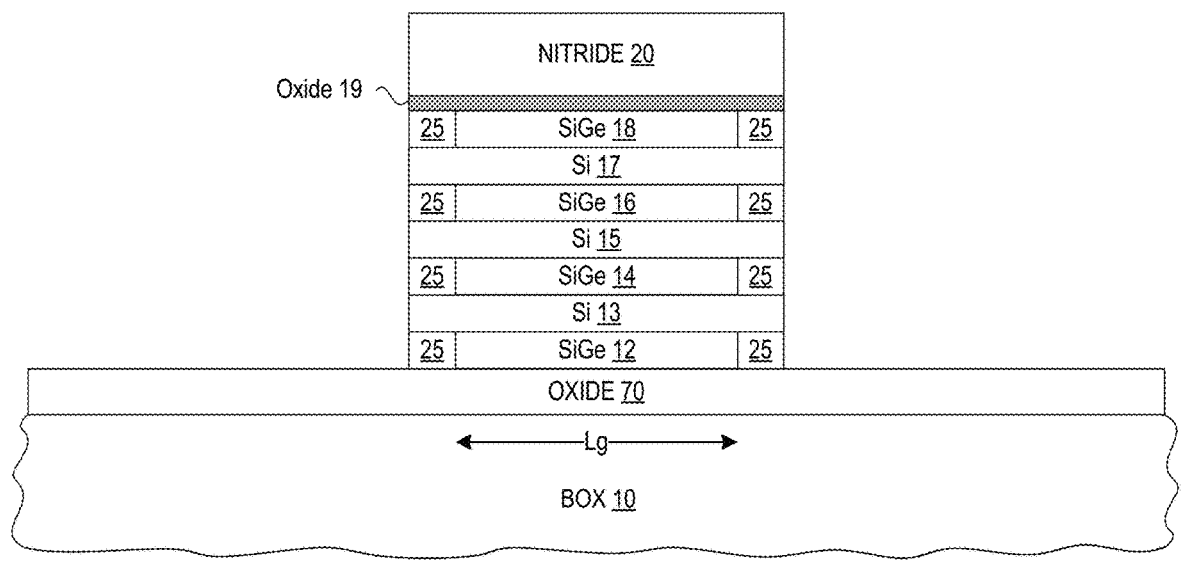
FIG. 24 is a partial cross-sectional view of a semiconductor structure subsequent to FIG. 4 after forming a replacement oxide layer at the bottom of the transistor stack in accordance with selected fourth embodiments of the present disclosure.

To provide a further improvement in the fabrication of stacked nanosheet FET devices by reducing the source/drain resistance, reference is now made to FIG. 24 which depicts a partial cross-sectional view of a semiconductor structure subsequent to FIG. 4 after forming a replacement oxide layer 70 at the bottom of the transistor stack 12-20. As disclosed herein, any suitable process may be used to form the replacement oxide layer 70, such as by forming a patterned photoresist layer or etch mask (not shown) which exposes the bottom silicon nanosheet layer 11 so that a suitable lateral silicon etch (e.g., isotropic silicon wet etch) is applied to remove the bottom silicon nanosheet layer 11 except for stack ends in the width dimension (e.g., perpendicular to the gate length dimension) that remain to support the transistor stack 12-20. After etching the bottom silicon nanosheet layer 11, the resulting opening is filled with one or more oxide layers to form the replacement oxide layer 70, such as by using one or more conformal CVD oxide layers to fill the opening and form the replacement oxide layer 70. Subsequently, the remnant stack ends of the bottom silicon nanosheet layer 11 can be etched away in subsequent processing.

Figure 25:
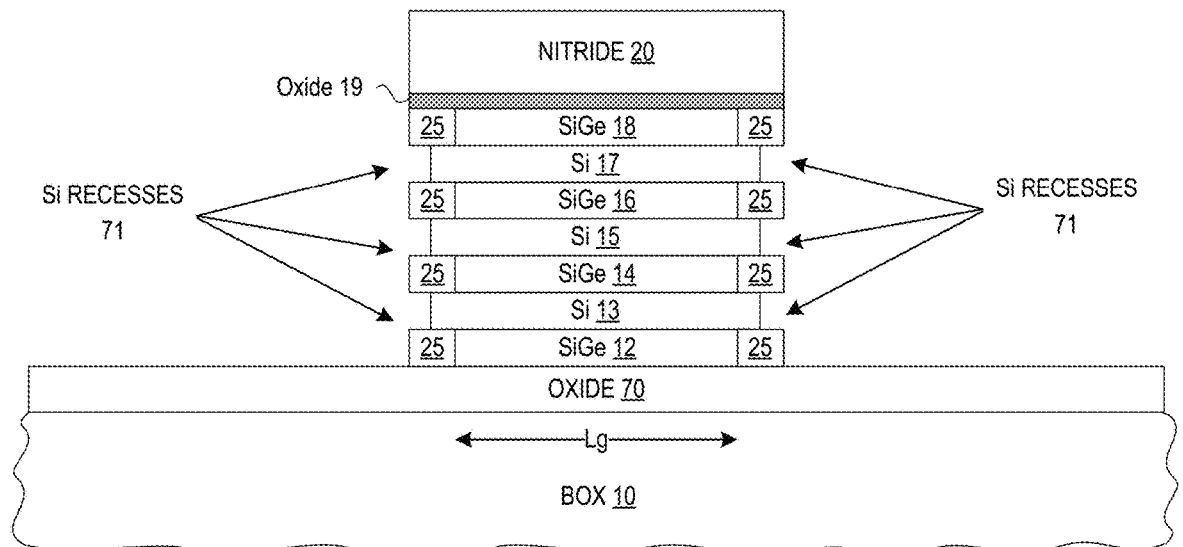
FIG. 25 illustrates processing of the semiconductor structure subsequent to FIG. 24 after selectively recessing Si layers to form recess openings on the exposed sides of the transistor stack.

FIG. 25 illustrates processing of the semiconductor structure subsequent to FIG. 24 after selectively recessing Si layers to form recess openings 71 on the exposed sides of the transistor stack. While any suitable Si etch process may be used, silicon recess openings 71 may be formed by selectively and isotropically recessing the Si nanosheet layers 13, 15, 17 on the exposed sides of the transistor stack 12-20 with a controlled Si recess etch process, such as a timed isotropic dry etch. At the conclusion of the etching process, the remnant Si portions 13, 15, 17 of the transistor stack remain where the recess openings 71 have not been formed and are wider than a first gate length dimension Lg for the subsequently formed nanosheet transistor. As will be appreciated, the etched sidewall edges of the remnant Si layers 13, 15, 17 may have a substantially vertical or slightly curved profile resulting from the selective Si recess etch. In addition, the depicted silicon recess openings 71 are shown as extending only partially beneath the inner spacers 25, but should extend no further than the lateral edges of the SiGe layers 12, 14, 16, 18 where the gate electrodes are subsequently formed.

Figure 26:
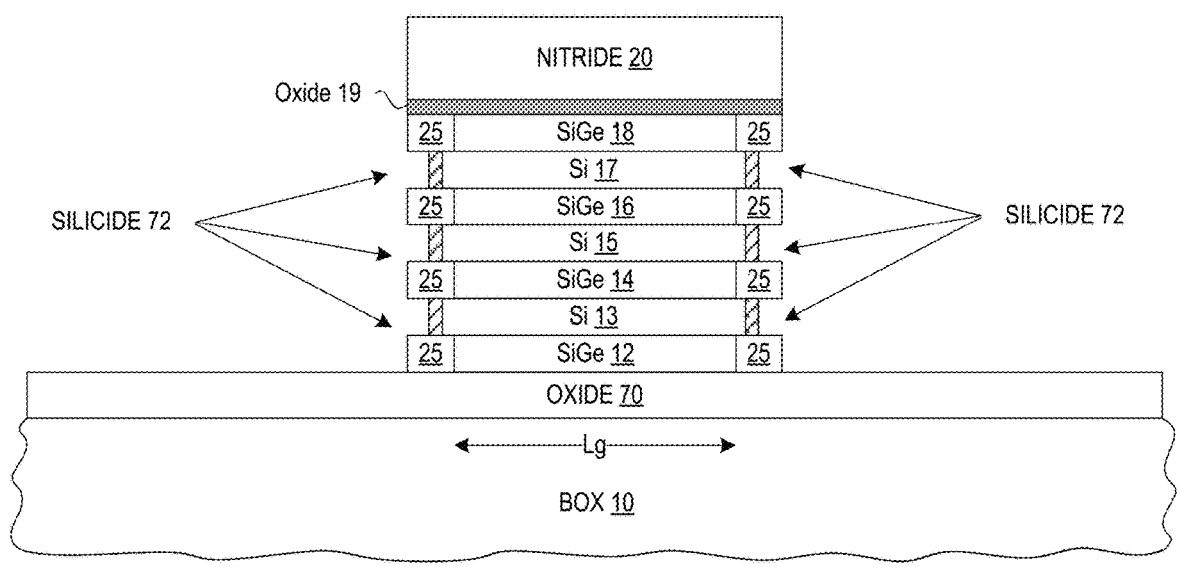
FIG. 26 illustrates processing of the semiconductor structure subsequent to FIG. 25 after forming silicide source/drain contact layers on exposed sidewalls of the silicon layers in the transistor stack.
Figure 27:
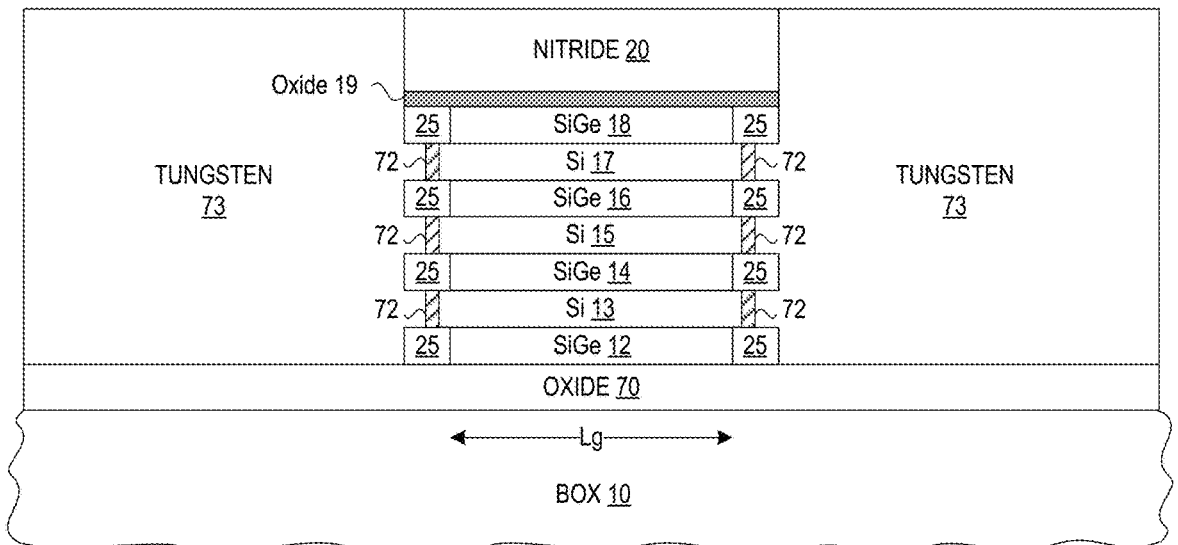
FIG. 27 illustrates processing of the semiconductor structure subsequent to FIG. 26 after forming planarized metal source/drain structures adjacent to the transistor stack and in contact with the silicide source/drain contact layers.

FIG. 26 illustrates processing of the semiconductor structure subsequent to FIG. 27 after forming silicide source/drain contact layers 72 on exposed sidewalls of the recessed nanosheet silicon layers 13, 15, 17 in the transistor stack. While any desired silicide formation process may be used to form the silicide layers 72 (such as $CoSi_2$ or NiSi), an example silicide formation sequence would be to deposit or sputter a conductive or metal layer (e.g., cobalt or nickel) over the semiconductor structure, followed by a heating step to react the metal layer with the exposed sidewalls of the recessed nanosheet silicon layers 13, 15, 17 to form silicide layers 72. In the depicted example, the silicide layers 72 are formed by partially converting or consuming the remnant nanosheet silicon layers 13, 15, 17, but it will be appreciated that the silicide layers 72 may be formed on the surface of the remnant nanosheet silicon layers 13, 15, 17. As will be appreciated, the sidewalls of the silicide layers 72 may have a substantially vertical or slightly curved profile, and may even extend outside of the silicon recess openings 71, depending on the silicide formation process used.

FIG. 27 illustrates processing of the semiconductor structure subsequent to FIG. 26 after forming planarized metal source/drain structures 73 adjacent to the transistor stack and in contact with the silicide source/drain contact layers 72. While any suitable source/drain fabrication sequence may be used, the metal source/drain structures 73 may be formed by depositing an initial seed layer over the semiconductor structure and then depositing one or more conductive layers (e.g., Tungsten), alone or in combination with barrier metal or liner layers, to cover the transistor stack and adjacent regions with a thickness that is at least as tall as the transistor stack. In addition, one or more etch or polish steps may be applied to planarize the top surface of the metal source/drain structures 73 to be level with the top of the transistor stack.

Figure 28:
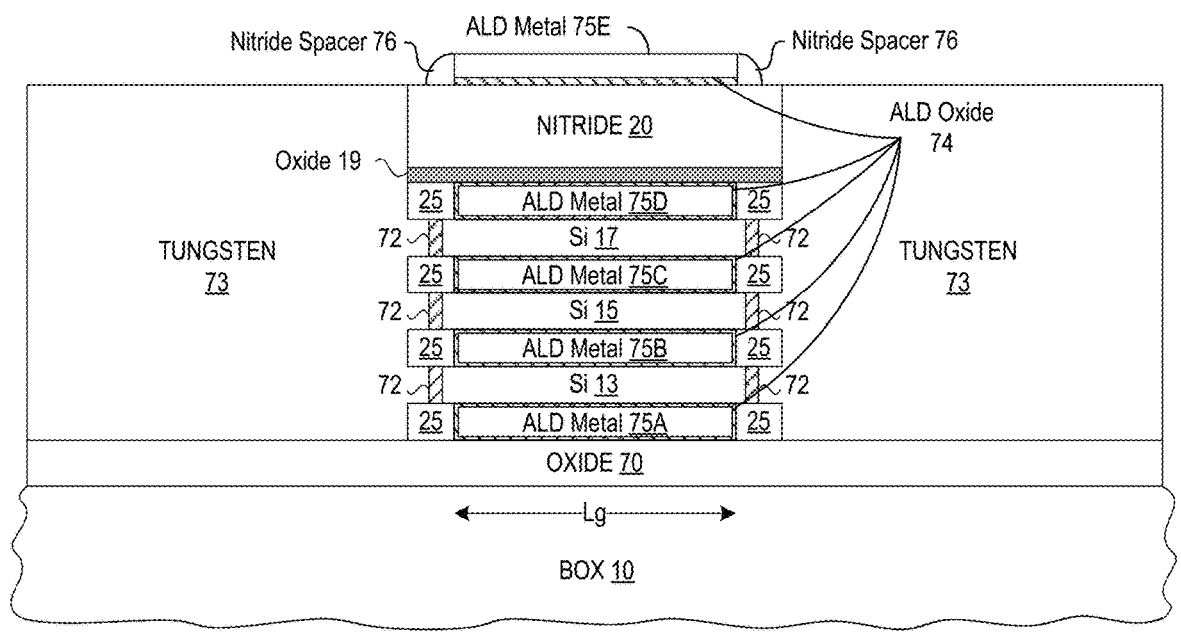
FIG. 28 illustrates processing of the semiconductor structure subsequent to FIG. 27 after forming a gate electrode on the transistor stack by sequentially forming, patterning, and etching an ALD oxide layer and ALD metal layer to fill one or more gate openings of the transistor stack.

FIG. 28 illustrates processing of the semiconductor structure subsequent to FIG. 27 after forming a gate electrode stack 74, 75 in the transistor stack using any suitable gate electrode stack formation sequence, such as the sequence depicted in FIGS. 7-12. For example, an active photo etch process may be applied to access the SiGe nanosheet layers 12, 14, 16, 18, followed by application of a selective isotropic etching of the exposed SiGe nanosheet layers 12, 14, 16, 18 to form gate electrode openings in the transistor stack. In the gate electrode openings, gate electrode stacks are formed by sequentially depositing an ALD oxide layer 74 and ALD metal layer 75 in at least the gate electrode openings of the transistor stack and over the upper surface of the semiconductor structure. Subsequently, a photo etch process may be applied to form a gate electrode on the transistor stack by selectively etching the ALD metal layer 75E and ALD oxide layer 74, such as by forming a patterned photoresist layer or etch mask (not shown) to protect the gate stack layers formed on the transistor stack against one or more directional etching steps (e.g., RIE) having suitable etch chemistry properties to remove unmasked portions of the ALD metal layer 75E and ALD oxide layer 74 from the surface of the transistor stack. And after forming the gate electrode, sidewall spacers 76 may be formed adjacent to the gate electrode using any suitable spacer formation sequence. For example, one or more dielectric layers, such as a nitride layer, may be deposited over the semiconductor structure to conformally cover the gate electrode and planarized metal source/drain structures 73, and then an anisotropic etch process may be applied to remove the dielectric layer(s) from the top surfaces of the transistor stack and planarized metal source/drain structures 73 but leaving remnant sidewall spacers 76 at the sides of the gate electrode.

At the process stage shown in FIG. 28, the fabrication of the nanosheet transistors in the transistor stack is complete except for any additional contact formation or back-end of line steps to provide external contacts to the gate, source and drain regions. As shown, the depicted transistor stack includes a first nanosheet transistor including the first silicon channel region 17 under control of a gate electrode 75C, 75D, a second nanosheet transistor including the second silicon channel region 15 under control of a gate electrode 75C, 75B, and a third nanosheet transistor including the third silicon channel region 13 under control of a gate electrode 75B, 75A. As illustrated, the nanosheet FET transistor is formed with low-resistance source/drain regions which include silicide source/drain contact layers 72 formed on recessed silicon nanosheet channel layers 13, 15, 17 of the transistor stack and in direct electrical contact with planarized tungsten source/drain regions 73.

Figure 29:
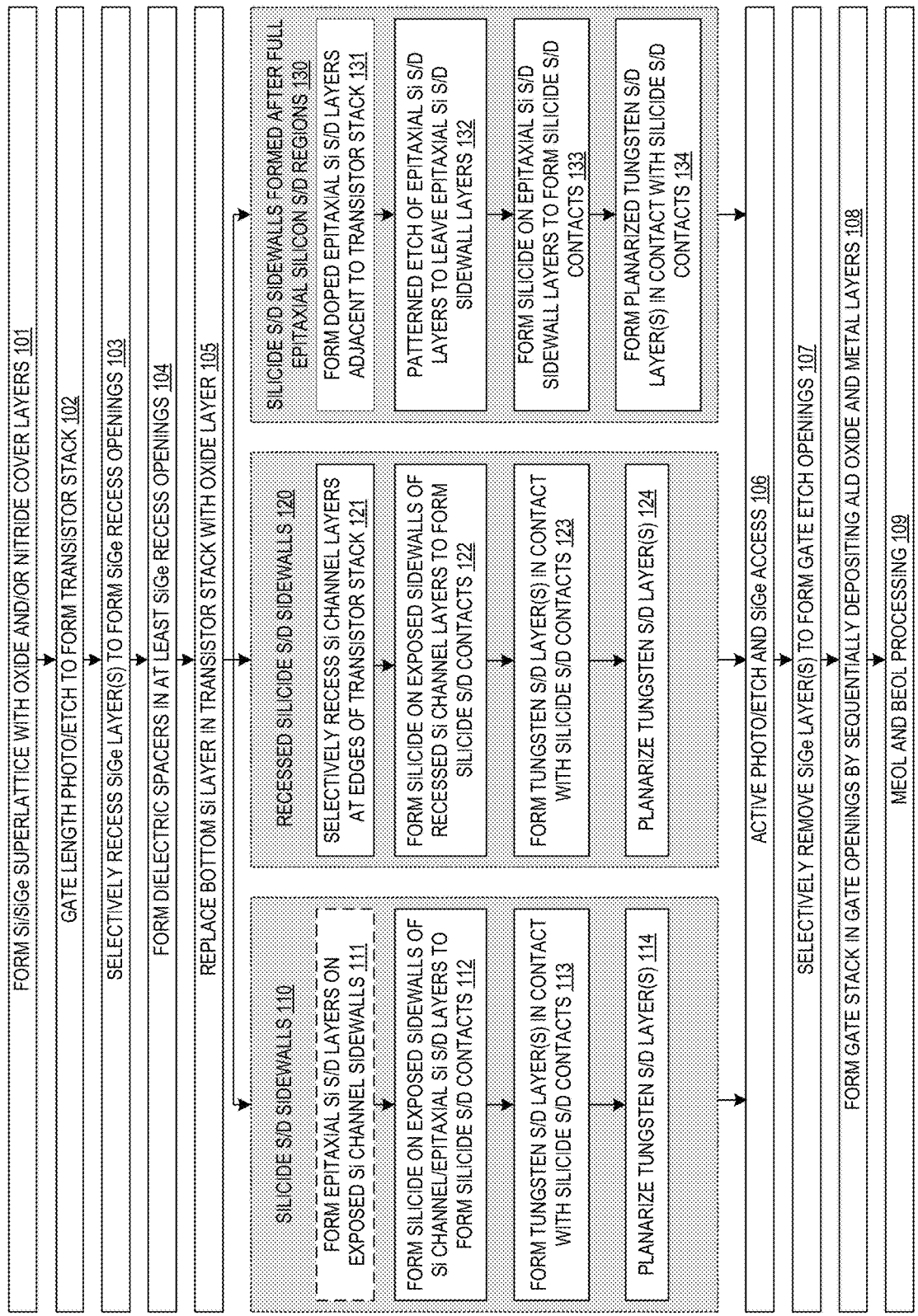
FIG. 29 illustrates a simplified process flow for fabricating nanosheet transistor devices in accordance with selected embodiments of the present disclosure.

FIG. 29 illustrates a simplified process flow 100 for fabricating nanosheet transistor devices in accordance with selected embodiments of the present disclosure. The process begins at step 101 with a wafer substrate which is processed to form a silicon/silicon germanium superlattice structure on the wafer substrate. In selected embodiments, the silicon/silicon germanium superlattice structure is formed as a Si/SiGe epi stack by epitaxially growing alternating layers of Si and SiGe on a buried oxide substrate layer, and then covering the Si/SiGe epi stack by depositing an oxide protective layer and/or a protective nitride layer.

At step 102, the Si/SiGe epi stack is processed with a gate length photo/etch process to form a transistor stack. For example, a photoresist layer may be deposited, patterned, etched and developed to form a patterned photoresist or hard mask layer on the protective oxide or nitride layer. With the patterned photoresist/hard mask layer in place, the processing at step 102 may include applying one or more etch processes to create a transistor stack. The etch processing can include a sequence of reactive-ion etching (RIE) steps having suitable etch chemistry properties to sequentially remove exposed portions of the protective oxide or nitride and underlying layers of the Si/SiGe epi stack.

At step 103, the SiGe layers at the exposed sides of the transistor stack are selectively etched or recessed to form SiGe recess openings. For example, a controlled etch process, such as a timed isotropic dry etch, may be applied to selectively recess the SiGe layers exposed at the sides of the transistor stack, thereby forming SiGe recess openings in the transistor stack by partially recessing SiGe layers.

At step 104, dielectric spacers are formed in the SiGe recess openings of the transistor stack. For example, an inner nitride layer may be deposited over the semiconductor structure, and then patterned and isotropically etched to leave the inner nitride layer only in the SiGe recess openings of the transistor stack.

At step 105, the bottom silicon layer is replaced with a replacement dielectric layer, such as a replacement oxide layer. In selected embodiments, a bottom silicon nanosheet layer is removed by using a photo etch step to access the bottom silicon nanosheet between transistor stacks, and then performing a lateral silicon etch process to remove the bottom silicon nanosheet layer before filling the etched space with one or more dielectric layers, such as an oxide fill layer.

At this process stage, one or more Si/SiGe superlattice transistor stacks are formed on the replacement dielectric layer, and any of three different additional source/drain processing sequences 110, 120, 130 can be used to fabricate highly conductive source/drain regions on opposed sides of each Si/SiGe superlattice transistor stack. While the specific details of the additional source/drain processing sequences 110, 120, 130 can each be varied to meet the needs of a particular application, the following description sets forth example embodiments for fabricating nanosheet transistors with low resistance source/drain regions.

At step 110, a first silicide source/drain sidewall processing sequence is performed to fabricate silicide source/drain channel sidewalls on each Si/SiGe superlattice transistor stack. The first silicide source/drain sidewall processing sequence 110 may start with one or more initial processing steps 111 for forming epitaxial silicon source/drain layers on exposed sidewalls of the silicon nanosheet layers in the Si/SiGe superlattice transistor stack to facilitate electrical connection to subsequently-formed conductive source/drain regions. The initial processing steps 111 may use an epitaxial semiconductor process to form doped epitaxial silicon source/drain layers along the sidewall of each Si/SiGe superlattice transistor stack in order to provide silicon channel strain engineering benefits for the silicon channel layers. However and as indicated with the dashed lines, the initial processing step(s) 111 may be omitted from the first source/drain processing sequence 110. Regardless of whether the epitaxial silicon source/drain formation step 111 occurs, the first silicide source/drain sidewall processing sequence 110 includes a silicide formation step 112 wherein silicide layers are formed on exposed silicon sidewalls of transistor stack, thereby forming silicide source/drain contacts. When preceded by the epitaxial silicon source/drain formation step 111, the silicide layers formed at step 112 are formed on the exposed silicon sidewalls of the epitaxial silicon source/drain layers. However, when the epitaxial silicon source/drain formation step 111 is omitted, the silicide layers formed at step 112 are formed on the exposed silicon sidewalls of the silicon channel layers in the transistor stack. The first silicide source/drain sidewall processing sequence 110 also includes a tungsten source/drain layer formation step 113 whereby one or more metallic layers are deposited over the transistor stack to form tungsten source/drain layers that make direct electrical contact with the silicide source/drain contacts. In addition, the first silicide source/drain sidewall processing sequence 110 may include a planarization step 114 whereby a planarization process (e.g., CMP) or selective etch process may be applied to form the planarized tungsten source/drain layers.

At step 120, a second recessed silicide source/drain processing sequence is performed to fabricate recessed silicide source/drain channel sidewalls on each Si/SiGe superlattice transistor stack. The second recessed silicide source/drain processing sequence 120 may start with one or more initial processing steps 121 for selectively recessing or etching silicon channel layers at the edge of the transistor stack. As a result of step 121, each silicon nanosheet layer in the Si/SiGe superlattice transistor stack is partially recessed to form recess openings on the exposed sides of the transistor stack which define exposed silicon sidewalls of the recessed silicon nanosheet layers. The second recessed silicide source/drain processing sequence 120 may also include one or more silicide formation steps 122 wherein silicide layers are formed on exposed silicon sidewalls of the transistor stack, thereby forming silicide source/drain contacts. The second recessed silicide source/drain processing sequence 120 also includes a tungsten source/drain layer formation step 123 whereby one or more metallic layers are deposited over the transistor stack to form tungsten source/drain layers that make direct electrical contact with the silicide source/drain contacts. In addition, the second recessed silicide source/drain processing sequence 120 may include a planarization step 124 whereby a planarization process (e.g., CMP) or selective etch process may be applied to form the planarized tungsten source/drain layers.

At step 130, a third silicide source/drain processing sequence is performed to fabricate silicide source/drain channel sidewalls on each Si/SiGe superlattice transistor stack after forming full epitaxial silicon source/drain regions. The third silicide source/drain processing sequence 130 may start with one or more initial processing steps 131 for forming doped epitaxial semiconductor layers in the intended source/drain regions which are doped using any suitable doping technique. For example, the doped epitaxial source/drain regions may be in-situ doped during the epitaxial semiconductor process, such as by doping epitaxially grown silicon source/drain features with boron, arsenic and/or phosphorus to form doped epitaxial silicon source/drain regions. In addition or in the alternative, an implantation process may be performed to dope the epitaxial silicon source/drain regions. As will be appreciated, the doping processing may be controlled and applied in separate processing sequences for each of N-type and P-type source/drain features. In addition, the formation of doped epitaxial silicon source/drain regions may include one or more anneal processes to promote formation of crystalline structures in the epitaxial source/drain regions and/or may include one or more etch or polish steps to planarize the top surface of the epitaxial source/drain regions. As a result of step 131, each silicon nanosheet layer in the Si/SiGe superlattice transistor stack is subjected to compressive stress from the epitaxial growth process used in step 131. In addition, the third silicide source/drain processing sequence 130 may include a patterned etch step 132 that is applied to etch the outer portions of the epitaxial silicon source/drain layers, thereby forming epitaxial silicon source/drain sidewall layers on the sidewalls of the transistor stack. The third silicide source/drain processing sequence 130 may also include one or more silicide formation steps 133 wherein silicide layers are formed on exposed epitaxial source/drain silicon sidewalls of the transistor stack, thereby forming silicide source/drain contacts. The third silicide source/drain processing sequence 130 also includes a planarized tungsten source/drain layer formation step 134 whereby one or more metallic layers are deposited over the transistor stack to form tungsten source/drain layers that make direct electrical contact with the silicide source/drain contacts, where a planarization process (e.g., CMP) or selective etch process may be applied to form the planarized tungsten source/drain layers. While the third silicide source/drain processing sequence 130 may be performed after the oxide replacement step 105 and before selectively etching the SiGe layer (steps 106-107 described below), it will be appreciated that steps 132-134 could be performed after forming the gate stack electrodes in the transistor stack (step 108 described below), though the initial processing step(s) 131 for forming doped epitaxial semiconductor layers in the intended source/drain regions should be performed before selectively etching the SiGe layer and forming the gate stack electrodes in the transistor stack.

At step 106, the transistor stack is processed with an active photo/etch process to access the underlying SiGe layers in the transistor stack. For example, a photoresist layer may be deposited, patterned, etched and developed to form a patterned photoresist or hard mask layer with mask openings positioned over the transistor stack to access the underlying SiGe layers in the transistor stack. With the patterned photoresist/hard mask layer in place, the photo/etch process may include applying one or more etch processes to access the underlying SiGe layers in the transistor stack. The etch processing can include a sequence of reactive-ion etching (RIE) steps having suitable etch chemistry properties to sequentially remove exposed portions of the underlying layers, but without removing the accessed SiGe layers.

At step 107, the SiGe layers at the exposed transistor stack are selectively etched to form gate etch openings by removing the remnant SiGe layers in the transistor stack. For example, a controlled etch process, such as a timed isotropic dry etch, may be applied to selectively etch and remove the SiGe layers exposed at the transistor stack, thereby forming gate etch openings where the remnant SiGe layers were located in the transistor stack.

At step 108, gate electrodes are formed in the gate etch openings of the transistor stack. For example, the gate electrodes may be formed by depositing an ALD oxide layer to form a conformal thin dielectric layer in the gate etch openings of the transistor stack, and then depositing an ALD metal layer to form gate electrodes by filling the gate etch openings. To clear the top surface of the transistor stack and doped source/drain epitaxial layers, one or more etch processes may be applied which have suitable etch chemistry properties to sequentially remove the ALD metal layer and ALD oxide layer formed on the top surface of the semiconductor structure.

At step 109, additional interconnects and conductors are formed with any desired Middle End Of Line (MEOL) and Back End of Line (BEOL) processing steps.

As disclosed herein, any suitable nanosheet fabrication process may be adapted to include low-resistance source/drain regions. For example, the stacked nanosheet devices illustrated in FIGS. 1-28 can be fabricated with metal source/drain regions which include at least a metal silicide channel sidewall and metal source/drain region, alone or in combination with an epitaxial semiconductor source/drain channel sidewall region. However, there are other nanosheet transistor device structures that may also be adapted to include low-resistance source/drain regions, including but not limited to CFET nanosheet transistor devices, forksheet nanosheet transistor devices, and the like.

Figure 30:
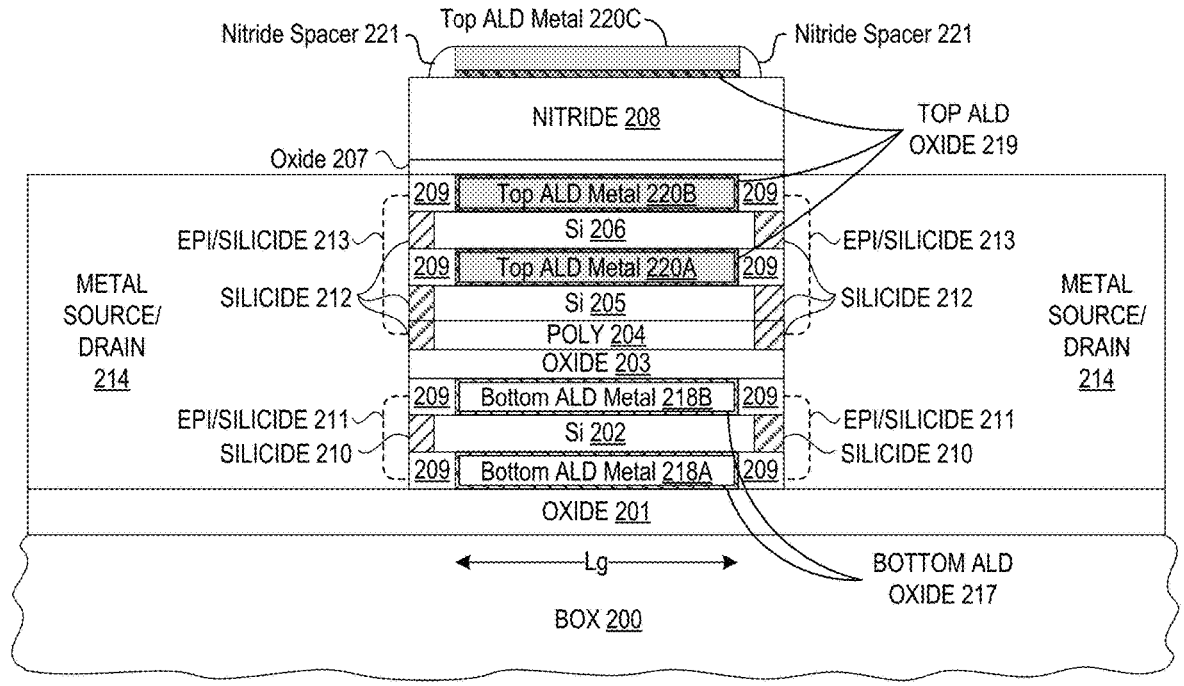
FIG. 30 is a partial cross-sectional view of a first CFET nanosheet transistor device with low-resistance source/drain regions formed in accordance with selected embodiments of the present disclosure.

To provide additional details for an improved contextual understanding of such embodiments of the present disclosure, reference is now made to FIG. 30 which depicts a partial cross-sectional view of a first CFET nanosheet transistor device with low-resistance or metal source/drain regions 214 formed adjacent to a CFET transistor stack to connect an upper or top nanosheet transistor and lower or bottom nanosheet transistor formed in the transistor stack. Since the specific fabrication sequence used to form the CFET transistor stack will largely follow the processing steps described hereinabove with respect to the various embodiments depicted in FIGS. 1-29, there is no need to belabor the processing details. However, a processing flow summary would include the following steps which are described using reference numerals to convey the relative sequential ordering for fabrication of the device elements.

As an initial step, a first stack of alternating silicon layers 202 and silicon germanium layers (not shown) are formed over a buried oxide layer 200 using epitaxial semiconductor growth steps which form the Si/SiGe epi stack from a silicon semiconductor layer (not shown) which is subsequently replaced with the oxide layer 201. On the first stack of alternating Si/SiGe layers, an oxide layer 203 and polysilicon or ALD silicon layer 204 are sequentially formed using any suitable deposition process. Subsequently, a second stack of alternating silicon layers 205, 206 and silicon germanium layers (not shown) are formed over the polysilicon/ALD silicon layer 204 using epitaxial semiconductor growth steps which form the Si/SiGe epi stack from the polysilicon/ALD silicon layer 204. On the second Si/SiGe epi stack, a covering oxide layer 207 and nitride layer 208 are sequentially formed using any suitable deposition process. If desired, the covering nitride layer 208 may be protected during subsequent nitride etch processing by forming a protective oxide layer (not shown) over the covering nitride layer 208.

After forming the covering oxide layer 207 and nitride layer 208, a gate length definition photo and etch process is applied to form an etched CFET transistor stack from the first stack of alternating Si/SiGe layers, the poly layer 204, oxide layer 203, and second stack of alternating Si/SiGe layers.

With the silicon germanium layers of the Si/SiGe epi stack exposed on the sidewall of the etched CFET transistor stack, a silicon germanium recess etch process is applied to partially recess the silicon germanium layers, followed by formation of inner nitride spacers 209, such as by depositing a nitride layer over the etched CFET transistor stack and then applying a suitable nitride etch process.

With the silicon layers 202, 204/205, 206 of the Si/SiGe epi stack exposed on the sidewall of the etched CFET transistor stack, the metal source/drain regions may be formed to include at least a metal silicide channel sidewall and metal source/drain region, alone or in combination with an epitaxial semiconductor source/drain channel sidewall region. For example, lower and upper silicide sidewall layers 210, 212 may be formed at the exposed sidewalls of the silicon layers 202, 204/205, 206 in the etched CFET transistor stack (such as illustrated in FIG. 5) or after performing a partial etch of the silicon layers 202, 204/205, 206 in the etched CFET transistor stack (as illustrated in FIGS. 25-26). In addition or in the alternative, the dashed lines illustrate that lower and upper epi/silicide sidewall layers 211, 213 may be formed at the exposed sidewalls of the silicon layers 202, 204/205, 206 in the etched CFET transistor stack by epitaxially forming a partial semiconductor source/drain region with a silicide cover layer (such as illustrated in FIGS. 13-14) or after epitaxially forming semiconductor source/drain regions which are then etched back and covered with a silicide cover layer (as illustrated in FIG. 22). Regardless of how the metal silicide channel sidewall and metal source/drain regions 210-213 are formed, metal source/drain structures 214 may then be formed by depositing and planarizing one or more metal layers (e.g., Tungsten) on each side of the etched CFET transistor stack, where the metal material used to form the metal layer is selected to have different etch properties from the metal material(s) used to subsequently form the gate electrodes.

With the planarized metal source/drain structures 214 formed on each side of the etched CFET transistor stack, the lower and upper gate electrodes may be sequentially formed by first performing an active photo/etch and SiGe access process to expose the SiGe layers in the etched CFET transistor stack, and then applying a SiGe etch process to selectively remove the exposed SiGe layers, thereby forming gate electrode openings in both the upper and lower portions of the etched CFET transistor stack. In these gate electrode openings, gate stacks are defined by first depositing a first ALD oxide layer 217 as a conformal gate dielectric layer on the gate electrode opening sidewalls, and then depositing a first ALD metal layer 218 on the first ALD oxide layer 217 to fill the gate electrode openings. As illustrated, the bottom ALD oxide layers 217 and bottom ALD metal layers 218A-B formed in the bottom of the etched CFET transistor stack define the bottom gate stack 217, 218A-B, but it will be appreciated that, at this stage of the fabrication process, the defined gate stack layers 217, 218 will also be formed in the top gate electrode openings.

After forming the bottom gate stack 217, 218A-B, it may be protected or isolated from subsequent gate stack processing using any suitable sequence, such as by depositing a protective organic oxide material (not shown) which is then flowed to cover and protect the bottom gate stack 217, 218A-B. Then, the gate stack layers 217, 218 in the top gate electrode openings are selectively removed by applying one or more selective etch processes to remove the first ALD oxide layer 217 and first ALD metal layer 218 from the top of the etched CFET transistor stack, where the metal etch process is selected so that the metal source/drain structures 214 are not etched, but the first metal ALD metal layer 218 is removed, thereby forming top gate electrode openings. In the top gate electrode openings, gate stacks are defined by depositing a second ALD oxide layer 219 as a conformal gate dielectric layer on the gate electrode opening sidewalls, and then depositing a second ALD metal layer 220 on the second ALD oxide layer 219 to fill the top gate electrode openings. As illustrated, the top ALD oxide layers 219 and top ALD metal layers 220A-C formed in the top of the etched CFET transistor stack define the top gate stack 219, 220A-C. As will be appreciated, the upper ALD oxide/metal layers 219, 220 may be formed with different materials than the bottom ALD oxide/metal layers 217, 218. After isotropically etching the protective organic oxide material, ALD metal layers 218, 220 and ALD oxide layers 217, 219 may be patterned and etched to form gate electrodes, followed by formation of nitride sidewall spacers 221 along with any MEOL and BEOL processing steps. The resulting CFET nanosheet transistor device is formed with separate top and bottom nanosheet transistors connected between shared metal source/drain regions 214, where the top nanosheet transistor includes silicon nanosheet channels 204/205, 206 controlled by the top gate electrode stack 219, 220, and where the bottom nanosheet transistor includes at least a first silicon nanosheet channel 202 controlled by the bottom gate electrode stack 217, 218. Of course, it will be appreciated that a CFET nanosheet transistor device with shared source/drain regions is not a likely electrical connection scheme, but this example is provided to demonstrate how a CFET nanosheet transistor device may include shared source/drain regions on one side of the top and bottom gate electrode stacks, but may include electrically separated source/drain regions on the other side of the top and bottom gate electrode stacks.

As will be appreciated, there may be embodiments where the top and bottom nanosheet transistors are not connected between shared metal source/drain regions, but are instead connected on one or both sides to separate metal source/drain regions. To provide additional details for an improved contextual understanding of such embodiments of the present disclosure, reference is now made to FIG. 31 which depicts a partial cross-sectional view of a second CFET nanosheet transistor device with bottom low-resistance source/drain regions 214 and separately formed top low-resistance source/drain regions 216 formed in accordance with selected embodiments of the present disclosure. Since the specific fabrication sequence used to form the second CFET nanosheet transistor stack will largely follow the processing steps described hereinabove, the following processing flow summary substantially follows the steps described hereinabove with reference to FIG. 30 using additional reference numerals to convey the relative sequential ordering for fabrication of the device elements.

In particular, the first stack of alternating silicon layers 202 and silicon germanium layers (not shown) are formed from a silicon semiconductor layer (not shown) that is formed over the buried oxide layer 200, followed by processing to replace the silicon semiconductor layer (not shown) with the oxide layer 201. On the first stack of alternating silicon layers 202, an oxide layer 203 and polysilicon or ALD silicon layer 204 are sequentially formed using any suitable deposition process. Subsequently, a second stack of alternating silicon layers 205, 206 and silicon germanium layers (not shown) are formed over the polysilicon/ALD silicon layer 204, followed by the sequential formation of a covering oxide layer 207 and nitride layer 208 (and additional protective oxide layer if needed) using any suitable deposition process. The first and second stacks of alternating Si/SiGe layers are then processed with a gate length definition photo and etch process to form an etched CFET transistor stack.

After the exposed sidewall silicon germanium layers are partially etched and then filled to form inner nitride spacers 209, the exposed sidewall silicon layers 202, 204/205, 206 are processed to form the metal source/drain regions to include at least metal silicide channel sidewalls 210, 212 and metal source/drain structures 214A, 216, alone or in combination with epitaxial semiconductor source/drain channel sidewall regions 211, 213. For example, lower and upper silicide sidewall layers 210, 212 may be formed at the exposed sidewalls of the silicon layers 202, 204/205, 206 in the etched CFET transistor stack (such as illustrated in FIG. 5) or after performing a partial etch of the silicon layers 202, 204/205, 206 in the etched CFET transistor stack (as illustrated in FIGS. 25-26). In addition or in the alternative, the dashed lines illustrate that lower and upper epi/silicide sidewall layers 211, 213 may be formed at the exposed sidewalls of the silicon layers 202, 204/205, 206 in the etched CFET transistor stack by epitaxially forming a partial semiconductor source/drain region with a silicide cover layer (such as illustrated in FIGS. 13-14) or after epitaxially forming semiconductor source/drain regions which are then etched back and covered with a silicide cover layer (as illustrated in FIG. 22).

Regardless of how the metal silicide channel sidewall and metal source/drain regions 210-213 are formed, metal source/drain structures 214A may then be formed on at least the bottom of each side of the etched CFET transistor stack by depositing one or more metal layers (e.g., Tungsten) to cover the top and sides of the etched CFET transistor stack, where the metal material used to form the metal layer is selected to have different etch properties from the metal material(s) used to subsequently form the gate electrodes. After performing a timed or controlled recess etch, the metal source/drain structure 214A is etched back to the top of the height of the first stack of alternating Si/SiGe layers (or the bottom of the oxide layer 203). At this point, a directional oxide layer 215 is deposited to cover the etched metal source/drain structure 214A using any suitable process, such as by forming a PECVD TEOS layer having substantially the same thickness as the oxide layer 203. If necessary, a short HF etch process may be applied to clear the thin oxide layer from the sidewalls of the etched CFET transistor stack.

With the etched metal source/drain structure 214A formed at the bottom of each side of the etched CFET transistor stack and covered by the directional oxide layer 215, metal source/drain structures 216 may then be formed on the top sides of the etched CFET transistor stack by depositing and planarizing one or more metal layers (e.g., Tungsten), where the metal material used to form the metal layer(s) is selected to have different etch properties from the metal material(s) used to subsequently form the gate electrodes.

With the bottom metal source/drain structures 214A and planarized top metal source/drain structures 216 formed on each side of the etched CFET transistor stack, the lower and upper gate electrodes may be sequentially formed by first accessing and selectively removing the SiGe layers to form gate electrode openings in both the upper and lower portions of the etched CFET transistor stack. In these gate electrode openings, gate stacks are defined by sequentially depositing a first ALD oxide layer 217 and a first ALD metal layer 218 to fill the gate electrode openings. After protecting the bottom gate stack 217, 218A-B, from subsequent gate stack processing by depositing and flowing a protective organic oxide material (not shown), the gate stack layers 217, 218 in the top gate electrode openings are selectively etched and removed, and then replaced by sequentially depositing a second ALD oxide layer 219 and a second ALD metal layer 220 to fill the top gate electrode openings. After isotropically etching the protective organic oxide material, ALD metal layers 218, 220 and ALD oxide layers 217, 219 may be patterned and etched to form gate electrodes, followed by formation of nitride sidewall spacers 221 along with any MEOL and BEOL processing steps. As a result, the top ALD oxide layers 219 and top ALD metal layers 220A-C formed in the top of the etched CFET transistor stack define the top gate stack for controlling the silicon nanosheet channels 205, 206 which are connected between the top metal source/drain structures 216. In addition, the bottom ALD oxide layers 217 and bottom ALD metal layers 218A-B formed in the bottom of the etched CFET transistor stack define the bottom gate stack for controlling at least a first silicon nanosheet channel 202 which is connected between the bottom metal source/drain structures 214A.

Figure 31:
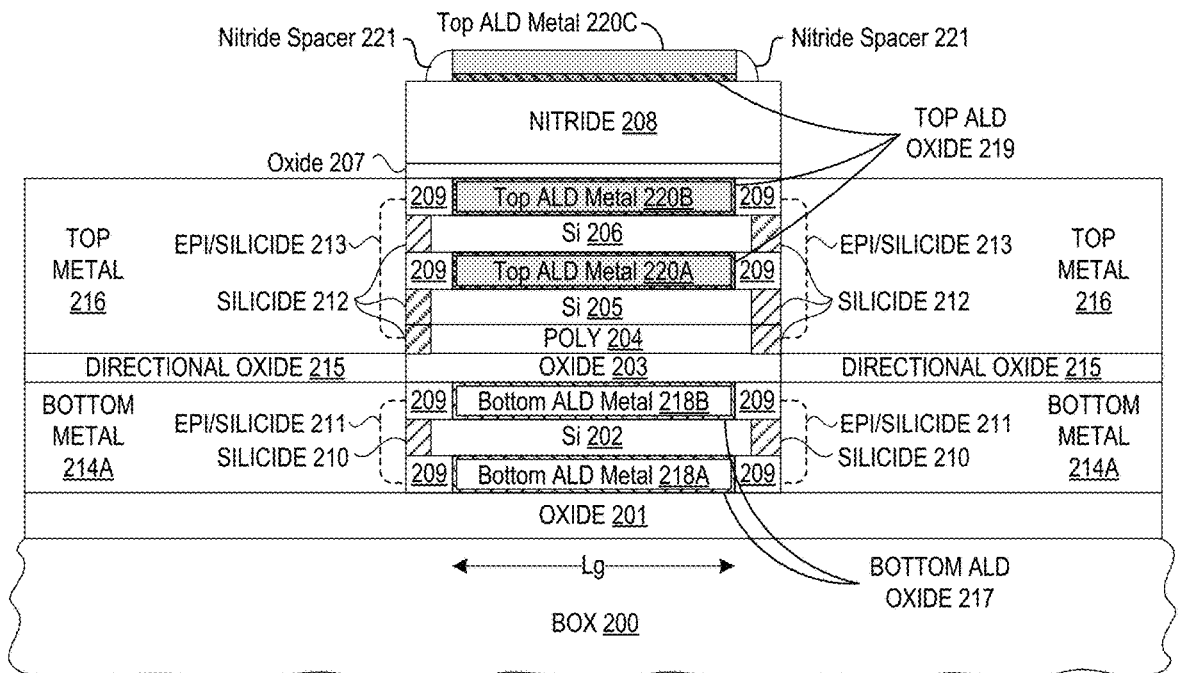
FIG. 31 is a partial cross-sectional view of a second CFET nanosheet transistor device with low-resistance source/drain regions formed in accordance with selected embodiments of the present disclosure.

As seen in FIGS. 30-31, the top of the etched CFET transistor stack includes a bottom silicon nanosheet channel layer 205 formed on the polysilicon/ALD silicon layer 204, resulting in a 3-sided gate structure for the bottom silicon nanosheet channel layer 205 since there is no underlying gate stack layer of ALD oxide and metal layers. In order to provide a gate-all around gate stack layer of ALD oxide and metal layers for the bottom silicon nanosheet channel layer 205, one can replace the polysilicon/ALD silicon layer 204 deposition with a polycrystalline or ALD SiGe layer deposition. This change would mean that there would not be silicide or epi on the sidewalls of the polycrystalline/ALD SiGe layer, and that instead the polycrystalline/ALD SiGe layer would be recess etched to form inner nitride spacers at the peripheral ends of the recessed polycrystalline/ALD SiGe layer.

In addition to CFET nanosheet transistor devices, there are other nanosheet transistor device structures that may also be adapted to include low-resistance source/drain regions, including but not limited to forksheet nanosheet transistor devices, and the like. As will be appreciated, forksheet nanosheet transistors are a type of gate-all-around transistor where both nFET and pFET devices are integrated in the same structure which includes a dielectric wall that separates the nFET and pFET devices. As a result, forksheet nanosheet transistors allow for a tighter n-to-p spacing and reduction in area. To provide additional details for an improved contextual understanding of such embodiments of the present disclosure, reference is now made to FIG. 32 which depicts a perspective view illustration of a semiconductor device at an intermediate stage of fabrication wherein a NFET forksheet transistor 301 and PFET forksheet transistor 302 are formed on opposite sides of a dielectric wall backbone 304 that extends up from a buried oxide substrate 300. When formed adjacent to the sidewalls of the backbone 304, the spacing between the transistors 301, 302 is equal to the width of the backbone 304 which enables the density of such forksheet transistors 301, 302 to be increased compared to other non-planar transistor architectures (e.g., fin-FETs, nanowire transistors, etc.).

At the depicted intermediate stage of fabrication, the NFET silicon channel nanosheets 305 and PFET silicon channel nanosheets 306 are formed over an oxide layer, with a plurality of NFET silicon channel nanosheets 305 aligned to extend in the y-direction, and with a plurality of PFET silicon channel nanosheets 306 aligned to extend in the y-direction. In addition, the NFET and PFET silicon channel nanosheets 305, 306 are formed to extend away (laterally) from the backbone 304 in the x-axis. In addition, the NFET and PFET silicon channel nanosheets 305, 306 extend in the z-axis direction to pass through a gate structure 315. The portions of the nanosheets 305, 306 within the gate structure 315 form the transistor channels, while the portions of the nanosheets 305, 306 on opposite sides of the gate structure 315 surrounded by inner nitride spacers 310 form the source/drain regions. In some implementations, the source/drain regions include an epitaxially grown semiconductor body, and the sheets 305, 306 may only be present within the gate structure 315. While the gate structure 315 is shown as being formed at this intermediate stage of fabrication for purposes of illustrating the relative positions of the gate and channel regions, it will be appreciated that the gate structure 315 can be formed later in the fabrication process, including after formation of the source/drain regions.

The specific fabrication sequence used to form the forksheet transistor devices will largely follow the processing steps described hereinabove, with a few additional processing steps relating to the formation of the dielectric wall backbone 304 and the patterning and placement of the NFET and PFET silicon channel nanosheets 305, 306, so there is no need to belabor the processing details. However, a processing flow summary would include the following steps which are described using reference numerals to convey to the relative sequential ordering for fabrication of the device elements.

Figure 32:
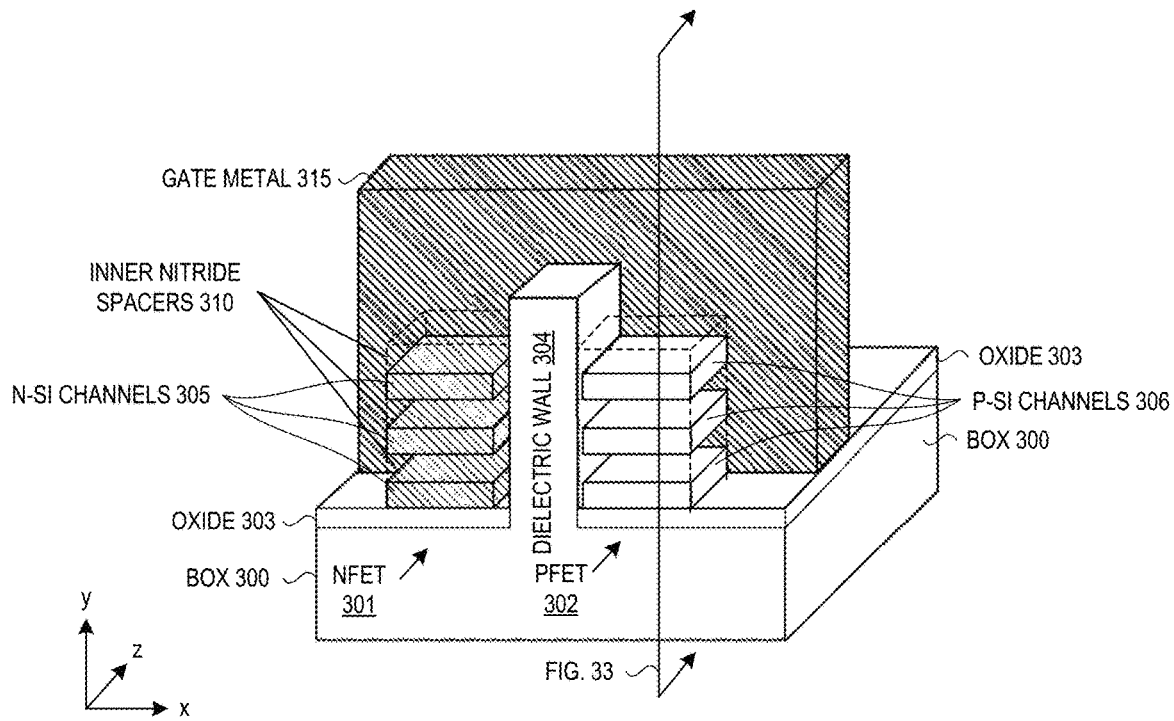
FIG. 32 is a perspective view illustration of a forksheet nanosheet transistor device at an intermediate stage of fabrication in accordance with selected embodiments of the present disclosure.
Figure 33:
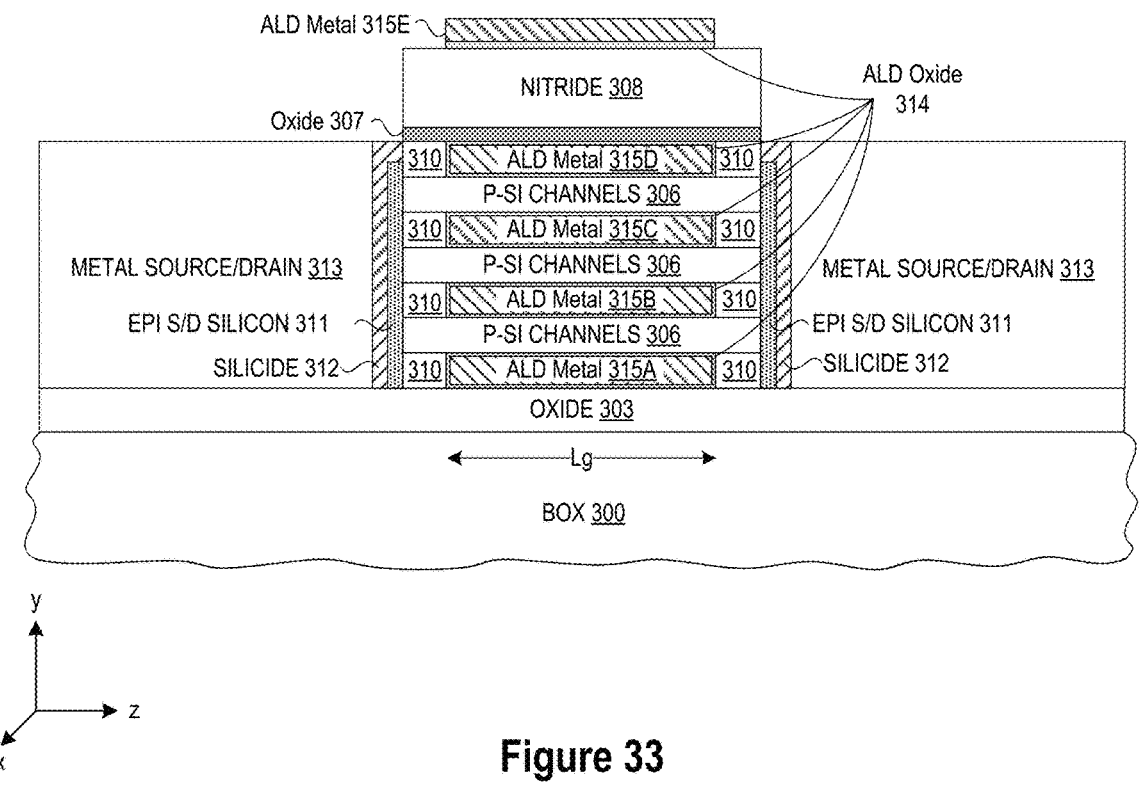
FIG. 33 is a partial cross-sectional view of a forksheet nanosheet transistor device with low-resistance source/drain regions formed in accordance with selected embodiments of the present disclosure.

In particular and with reference to FIG. 33, there is depicted a partial cross-sectional view of a forksheet transistor device taken along the FIG. 33 view line shown in FIG. 32 to illustrate the formation of low-resistance source/drain regions to include at least a metal silicide channel sidewall and metal source/drain region, alone or in combination with an epitaxial semiconductor source/drain channel sidewall region. In particular, a stack of alternating PFET silicon layers 306 and silicon germanium layers (not shown) are epitaxially formed from an initial silicon semiconductor layer (not shown) that is formed over the buried oxide layer 300 using any suitable deposition process, followed by processing to replace the silicon semiconductor layer (not shown) with the oxide layer 303. Subsequently, an oxide layer 307 and nitride layer 308 (and additional protective oxide layer if needed) are sequentially formed on the stack of alternating Si/SiGe layers using any suitable deposition process. With the covering layers 307, 308 in place, the stack of alternating Si/SiGe layers is then processed with a gate length definition photo and etch process to form an etched forksheet stack having exposed sidewall SiGe layers and exposed sidewall Si layers.

After partially etching the exposed sidewall SiGe layers to form recessed openings, a nitride layer is deposited and etched to form inner nitride spacers 310. In addition, the exposed sidewalls of the PFET silicon layers 306 are processed to form the metal source/drain regions to include at least a metal silicide channel sidewall and metal source/drain structure, alone or in combination with an epitaxial semiconductor source/drain channel sidewall region. For example, silicide sidewall layers (not shown) may be formed at the exposed sidewalls of the PFET silicon layers 306 in the etched forksheet stack (such as illustrated in FIG. 5) or after performing a partial etch of the PFET silicon layers 306 in the etched forksheet stack (as illustrated in FIGS. 25-26). In addition or in the alternative, epi/silicide sidewall layers 311, 312 may be formed at the exposed sidewalls of the PFET silicon layers 306 in the etched forksheet stack by epitaxially forming a partial semiconductor source/drain region 311 with a silicide cover layer 312 (such as illustrated in FIGS. 13-14) or after epitaxially forming semiconductor source/drain regions which are then etched back and covered with a silicide cover layer (as illustrated in FIG. 22).

Regardless of how the metal silicide channel sidewall and metal source/drain regions 311-312 are formed, metal source/drain structures 313 may then be formed on each side of the etched forksheet stack by depositing and planarizing one or more metal layers (e.g., Tungsten), where the metal material used to form the metal layer(s) is selected to have different etch properties from the metal material(s) used to subsequently form the gate electrodes.

With the planarized metal source/drain structures 313 formed on each side of the etched forksheet stack, the gate electrodes may be sequentially formed by first performing an active photo/etch and SiGe access process to expose the SiGe layers in the etched forksheet stack, and then applying a SiGe etch process to selectively remove the exposed SiGe layers, thereby forming gate electrode openings in the etched forksheet stack. In these gate electrode openings, gate stacks are defined by first depositing a first ALD oxide layer 314 as a conformal gate dielectric layer on the gate electrode opening sidewalls, and then depositing a first ALD metal layer 315 on the first ALD oxide layer 314 to fill the gate electrode openings. As illustrated, the ALD oxide layers 314 and ALD metal layers 315A-D formed in the etched forksheet stack define the gate stack, and the etched forksheet stack may be patterned and etched to leave at least ALD oxide layer 314 and ALD metal layer 315E. As will be appreciated, a separate gate stack may be formed for the NFET forksheet transistors by sequentially depositing a second ALD oxide layer and a second ALD metal layer to fill the gate electrode openings on the other side of the dielectric wall backbone 304. As will be appreciated, the first and second ALD oxide/metal layers may be formed with different materials. For example, the first and second ALD metal layers may use work function setting materials that are different for the NFET and PFET transistors. On the PFET transistor, the first ALD metal layer may be formed with a TiN layer, and on the NFET transistor, the second ALD metal layer may be formed with a TiAl layer. This may be accomplished by first depositing a TiN layer to fill the gate electrode openings on both the NFET and PFET transistors, and then applying a patterned etch to remove the TiN layer from the NFET transistors, followed by depositing a TiAl layer to fill the gate electrode openings on the NFET transistors.

The resulting forksheet transistor device is formed with separate NFET and PFET nanosheet transistors on each side of the dielectric wall backbone 304. By planarizing the gate 315 with the dielectric wall backbone 304, separate gate structures may be formed for the NFET and PFET nanosheet transistors. In addition, the NFET and PFET nanosheet transistors formed on each side of the dielectric wall backbone 304 may be connected between shared metal source or drain regions 313. Alternatively, the metal source/drain regions 313 may be patterned and etched into separate metal source/drain regions 313 for the NFET and PFET nanosheet transistors, It will be appreciated that additional processing steps will be used to complete the fabrication of the nanosheet transistor devices into functioning devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

By now it should be appreciated that there has been provided a method for forming a semiconductor device having nanosheet transistor devices. In the disclosed method, a stack of alternating first and second semiconductor layers is provided on a substrate, where the stack includes a plurality of first semiconductor layers interspersed with a plurality of second semiconductor layers. In selected embodiments, the first semiconductor layer includes a silicon nanosheet layer, and the second semiconductor layer includes a silicon germanium nanosheet layer. The disclosed method also includes selectively etching the stack of alternating first and second semiconductor layers to form a transistor stack on the substrate. In addition, the disclosed method includes forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack. The disclosed method also includes processing the transistor stack to form metal-containing current terminal or source/drain regions adjacent to the transistor stack and to form control electrode portions between the first semiconductor layers which form transistor channel regions in the transistor stack to connect the metal-containing current terminal regions, thereby forming a nanosheet transistor device with reduced source/drain resistance. As disclosed herein, the metal-containing current terminal regions may include one or more metals layers (e.g., Tungsten), including but not limited to one or more barrier metal layers, liner layers, and/or silicide layers. In selected embodiments, the processing of the transistor stack to form metal-containing current terminal regions includes forming epitaxial semiconductor sidewall layers from the first semiconductor layers exposed at sidewalls of the transistor stack; forming silicide sidewall layers on the epitaxial semiconductor sidewall layers which are adjacent to the transistor stack; and forming one or more metal layers on opposite sides of the transistor stack in electrical contact with the silicide sidewall layers to form the metal-containing current terminal regions which are adjacent to the transistor stack, such as by depositing a tungsten layer over the transistor stack to electrically contact the silicide sidewall layers, and planarizing the tungsten layer to form the metal-containing current terminal regions which are adjacent to the transistor stack. In other embodiments, the processing of the transistor stack to form metal-containing current terminal regions includes forming silicide sidewall layers on the first semiconductor layers exposed at sidewalls of the transistor stack, and then forming one or more metal layers on opposite sides of the transistor stack in electrical contact with the silicide sidewall layers to form the metal-containing current terminal regions which are adjacent to the transistor stack. In other embodiments, the processing of the transistor stack to form metal-containing current terminal regions includes selectively etching the first semiconductor layers on peripheral sides of the transistor stack to form partially etched first semiconductor layers having recessed sidewalls; forming silicide sidewall layers on the recessed sidewalls of the partially etched first semiconductor layers; and forming one or more metal layers on opposite sides of the transistor stack in electrical contact with the silicide sidewall layers to form the metal-containing current terminal regions which are adjacent to the transistor stack. In other embodiments, the processing of the transistor stack to form metal-containing current terminal regions includes forming doped epitaxial semiconductor regions adjacent to the transistor stack; selectively etching the doped epitaxial semiconductor regions on peripheral sides of the transistor stack to form doped epitaxial semiconductor sidewall layers on the sidewalls of the transistor stack; forming silicide sidewall layers on the doped epitaxial semiconductor sidewall layers which are adjacent to the transistor stack; and forming one or more metal layers on opposite sides of the transistor stack in electrical contact with the silicide sidewall layers to form the metal-containing current terminal regions which are adjacent to the transistor stack. In selected embodiments, the processing of the transistor stack to form control electrode portions includes selectively processing the transistor stack to form gate electrodes which replace the remnant second semiconductor layers in the transistor stack, thereby forming the nanosheet transistor device which includes the gate electrodes, the first semiconductor layers from the transistor stack, and the metal-containing current terminal regions. In selected embodiments, the transistor stack is processed to form metal-containing current terminal regions by forming bottom metal-containing current terminal regions on opposite sides of the transistor stack in electrical contact with silicide sidewall layers formed on one or more first semiconductor layers from the plurality of first semiconductor layers that are located in a bottom portion of the transistor stack; forming an insulating layer on the bottom metal-containing current terminal regions; and forming top metal-containing current terminal regions on opposite sides of the transistor stack in electrical contact with silicide sidewall layers formed on one or more first semiconductor layers from the plurality of first semiconductor layers that are located in a top portion of the transistor stack, where the insulating layer separates the bottom metal-containing current terminal regions from the top metal-containing current terminal regions, thereby forming the nanosheet transistor device as a complementary FET device. In selected embodiments, the disclosed method may include forming a dielectric wall backbone structure to separate the transistor stack into first stack of alternating first and second semiconductor layers and a second stack of alternating third and fourth semiconductor layers, and the processing of the transistor stack to form metal-containing current terminal regions includes forming first metal-containing current terminal regions on a first side of the dielectric wall backbone structure and on opposite ends of the first stack of alternating first and second semiconductor layers in electrical contact with silicide sidewall layers formed from the first semiconductor layers that are located in the first stack of alternating first and second semiconductor layers; and forming second metal-containing current terminal regions on a second, opposite side of the dielectric wall backbone structure and on opposite ends of the second stack of alternating third and fourth semiconductor layers stack in electrical contact with silicide sidewall layers formed from the third semiconductor layers that are located in the second stack of alternating third and fourth semiconductor layers, thereby forming the nanosheet transistor device as a forksheet nanosheet transistor device, where the first semiconductor layers are formed with a first conductivity type semiconductor material, and where the third semiconductor layers are formed with a second, opposite conductivity type semiconductor material.

In another form, there is provided a method for fabricating a semiconductor device which includes stacked nanosheet transistors. In the disclosed fabrication method, a semiconductor substrate is provided along with a superlattice stack structure including alternating silicon and silicon germanium nanosheet layers formed on the substrate. The disclosed fabrication method also selectively etches the superlattice stack structure to form a patterned nanosheet stack of alternating silicon and silicon germanium nanosheet layers. In addition, the disclosed fabrication method processes the patterned nanosheet stack to form metal-containing current terminal structures adjacent to the patterned nanosheet stack and to form a nanosheet transistor comprising control terminal electrodes formed around at least three sides of the silicon nanosheet layers from the patterned nanosheet stack which are connected between the metal-containing current terminal structures formed on opposite sides of the patterned nanosheet stack. In selected embodiments, the metal-containing current terminal structures are formed by selectively processing the patterned nanosheet stack to form silicide sidewall layers on peripheral sides of the silicon nanosheet layers in the patterned nanosheet stack, and then forming one or more metal layers on opposite sides of the patterned nanosheet stack in electrical contact with the silicide sidewall layers to form the metal-containing current terminal structures which are adjacent to the patterned nanosheet stack. In other embodiments, the metal-containing current terminal structures are formed by selectively processing the patterned nanosheet stack to form epitaxial semiconductor sidewall layers from the silicon nanosheet layers in the patterned nanosheet stack; forming silicide sidewall layers on the epitaxial semiconductor sidewall layers which are adjacent to the patterned nanosheet stack; and forming one or more metal layers on opposite sides of the patterned nanosheet stack in electrical contact with the silicide sidewall layers to form the metal-containing current terminal structures which are adjacent to the patterned nanosheet stack. In other embodiments, the metal-containing current terminal structures are formed by selectively processing the patterned nanosheet stack to form doped epitaxial semiconductor regions adjacent to the patterned nanosheet stack; selectively etching the doped epitaxial semiconductor regions on peripheral sides of the patterned nanosheet stack to form doped epitaxial semiconductor sidewall layers on the sidewalls of the patterned nanosheet stack; forming silicide sidewall layers on the epitaxial semiconductor sidewall layers which are adjacent to the patterned nanosheet stack; and forming one or more metal layers on opposite sides of the patterned nanosheet stack in electrical contact with the silicide sidewall layers to form the metal-containing current terminal structures which are adjacent to the patterned nanosheet stack. In other embodiments, the patterned nanosheet stack is processed by selectively processing the patterned nanosheet stack to form dielectric spacer layers on peripheral sides of the patterned nanosheet stack which replace peripheral portions of the silicon germanium nanosheet layers in the patterned nanosheet stack and leave remnant silicon germanium nanosheet layers in the patterned nanosheet stack; and selectively processing the patterned nanosheet stack to form control terminal which replace the remnant silicon germanium nanosheet layers in the patterned nanosheet stack, thereby forming the nanosheet transistor.

In yet another form, there is provided a semiconductor device and associated method of fabrication. As disclosed, the semiconductor device includes a nanosheet transistor formed on a substrate. As formed, the nanosheet transistor includes a nanosheet stack having a plurality of nanosheet channel layers formed in alignment over the substrate. The nanosheet transistor also includes first and second metal-containing current terminal structures located on opposite ends of the nanosheet stack. In selected embodiments, the first and second metal-containing current terminal structures each include a silicide sidewall layer formed on a peripheral end of a nanosheet channel layer; and one or more metal layers formed in electrical contact with the silicide sidewall layer. In other embodiments, the first and second metal-containing current terminal structures each include an epitaxial semiconductor sidewall layer formed on a peripheral end of a nanosheet channel layer; a silicide sidewall layer formed on the epitaxial semiconductor sidewall layer; and one or more metal layers formed in electrical contact with the silicide sidewall layer. In addition, the nanosheet transistor includes a gate control electrode including portions between the plurality of nanosheet channel layers which connect the first and second metal-containing current terminal structures. In selected embodiments, the gate control electrode includes one or more metal gate layers formed on one or more oxide layers to surround the plurality of nanosheet channel layers which connect the first and second metal-containing current terminal structures. In selected embodiments, the nanosheet stack includes a top nanosheet stack formed over a bottom nanosheet stack, thereby forming the nanosheet transistor device as a complementary FET device. In other embodiments, the nanosheet stack includes a first conductivity type nanosheet stack and a second conductivity type nanosheet stack formed on opposite sides of a dielectric wall backbone structure, thereby forming the nanosheet transistor device as a forksheet nanosheet transistor device. In selected embodiments, the plurality of nanosheet channel layers may include recessed channel sidewalls that are recessed within the nanosheet stack, and the first and second metal-containing current terminal structures may each include a silicide sidewall layer formed on the recessed channel sidewalls of the plurality of nanosheet channel layers. Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted nanosheet transistor structures may be formed with different processing steps that can be combined and integrated with other device fabrication steps, and can utilize Si/SiGe superlattice structures having different numbers of SiGe and Si layers. Also, the various silicon-based constituent layers may be formed with different conductive materials than those disclosed. In addition, the epitaxial sources and drains may be p-type or n-type, depending on whether forming either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   providing a stack of alternating first and second semiconductor layers on a substrate, where the stack comprises a plurality of first semiconductor layers interspersed with a plurality of second semiconductor layers;
   selectively etching the stack of alternating first and second semiconductor layers to form a transistor stack;
   forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack; and
   processing the transistor stack to form metal-containing current terminal regions adjacent to the transistor stack and to form control electrode portions between the first semiconductor layers which form transistor channel regions in the transistor stack to connect the metal-containing current terminal regions, thereby forming a nanosheet transistor device;
   where processing the transistor stack to form metal-containing current terminal regions comprises:
      forming epitaxial semiconductor sidewall layers from the first semiconductor layers exposed at sidewalls of the transistor stack;
      forming silicide sidewall layers on the epitaxial semiconductor sidewall layers which are adjacent to the transistor stack; and
      forming one or more metal layers on opposite sides of the transistor stack in electrical contact with the silicide sidewall layers to form the metal-containing current terminal regions which are adjacent to the transistor stack.

2. The method of claim 1, where each first semiconductor layer comprises a silicon nanosheet layer, and where each second semiconductor layer comprises a silicon germanium nanosheet layer.

3. A method for forming a semiconductor device comprising:
   providing a stack of alternating first and second semiconductor layers on a substrate, where the stack comprises a plurality of first semiconductor layers interspersed with a plurality of second semiconductor layers;

selectively etching the stack of alternating first and second semiconductor layers to form a transistor stack;

forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack; and processing the transistor stack to form metal-containing current terminal regions adjacent to the transistor stack and to form control electrode portions between the first semiconductor layers which form transistor channel regions in the transistor stack to connect the metal-containing current terminal regions, thereby forming a nanosheet transistor device;

where processing the transistor stack to form control electrode portions comprises:

selectively processing the transistor stack to form gate electrodes which replace the remnant second semiconductor layers in the transistor stack, thereby forming the nanosheet transistor device comprising the gate electrodes, a channel region formed with the first semiconductor layers from the transistor stack, and the metal-containing current terminal regions.

4. The method of claim 3, where processing the transistor stack to form metal-containing current terminal regions comprises:

forming epitaxial semiconductor sidewall layers from the first semiconductor layers exposed at sidewalls of the transistor stack;

forming silicide sidewall layers on the epitaxial semiconductor sidewall layers which are adjacent to the transistor stack; and forming one or more metal layers on opposite sides of the transistor stack in electrical contact with the silicide sidewall layers to form the metal-containing current terminal regions which are adjacent to the transistor stack.

5. A method for forming a semiconductor device comprising:

providing a stack of alternating first and second semiconductor layers on a substrate, where the stack comprises a plurality of first semiconductor layers interspersed with a plurality of second semiconductor layers;

selectively etching the stack of alternating first and second semiconductor layers to form a transistor stack;

forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack; and processing the transistor stack to form metal-containing current terminal regions adjacent to the transistor stack and to form control electrode portions between the first semiconductor layers which form transistor channel regions in the transistor stack to connect the metal-containing current terminal regions, thereby forming a nanosheet transistor device;

where processing the transistor stack to form metal-containing current terminal regions comprises:

forming silicide sidewall layers on the first semiconductor layers exposed at sidewalls of the transistor stack; and forming one or more metal layers on opposite sides of the transistor stack in electrical contact with the silicide sidewall layers to form the metal-containing current terminal regions which are adjacent to the transistor stack.

6. A method for forming a semiconductor device comprising:

providing a stack of alternating first and second semiconductor layers on a substrate, where the stack comprises a plurality of first semiconductor layers interspersed with a plurality of second semiconductor layers;

selectively etching the stack of alternating first and second semiconductor layers to form a transistor stack;

forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack; and processing the transistor stack to form metal-containing current terminal regions adjacent to the transistor stack and to form control electrode portions between the first semiconductor layers which form transistor channel regions in the transistor stack to connect the metal-containing current terminal regions, thereby forming a nanosheet transistor device;

where processing the transistor stack to form metal-containing current terminal regions comprises:

selectively etching the first semiconductor layers on peripheral sides of the transistor stack to form partially etched first semiconductor layers having recessed sidewalls;

forming silicide sidewall layers on the recessed sidewalls of the partially etched first semiconductor layers; and forming one or more metal layers on opposite sides of the transistor stack in electrical contact with the silicide sidewall layers to form the metal-containing current terminal regions which are adjacent to the transistor stack.

7. A method for forming a semiconductor device comprising:

providing a stack of alternating first and second semiconductor layers on a substrate, where the stack comprises a plurality of first semiconductor layers interspersed with a plurality of second semiconductor layers;

selectively etching the stack of alternating first and second semiconductor layers to form a transistor stack;

forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack; and processing the transistor stack to form metal-containing current terminal regions adjacent to the transistor stack and to form control electrode portions between the first semiconductor layers which form transistor channel regions in the transistor stack to connect the metal-containing current terminal regions, thereby forming a nanosheet transistor device;

where processing the transistor stack to form metal-containing current terminal regions comprises:

forming doped epitaxial semiconductor regions adjacent to the transistor stack;

selectively etching the doped epitaxial semiconductor regions on peripheral sides of the transistor stack to form doped epitaxial semiconductor sidewall layers on the sidewalls of the transistor stack;
forming silicide sidewall layers on the doped epitaxial semiconductor sidewall layers which are adjacent to the transistor stack; and
forming one or more metal layers on opposite sides of the transistor stack in electrical contact with the silicide sidewall layers to form the metal-containing current terminal regions which are adjacent to the transistor stack.

8. A method for forming a semiconductor device comprising:
providing a stack of alternating first and second semiconductor layers on a substrate, where the stack comprises a plurality of first semiconductor layers interspersed with a plurality of second semiconductor layers;
selectively etching the stack of alternating first and second semiconductor layers to form a transistor stack;
forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack; and
processing the transistor stack to form metal-containing current terminal regions adjacent to the transistor stack and to form control electrode portions between the first semiconductor layers which form transistor channel regions in the transistor stack to connect the metal-containing current terminal regions, thereby forming a nanosheet transistor device;
where processing the transistor stack to form metal-containing current terminal regions adjacent to the transistor stack comprises:
forming bottom metal-containing current terminal regions on opposite sides of the transistor stack in electrical contact with silicide sidewall layers formed on one or more first semiconductor layers from the plurality of first semiconductor layers that are located in a bottom portion of the transistor stack;
forming an insulating layer on the bottom metal-containing current terminal regions; and
forming top metal-containing current terminal regions on opposite sides of the transistor stack in electrical contact with silicide sidewall layers formed on one or more first semiconductor layers from the plurality of first semiconductor layers that are located in a top portion of the transistor stack,
where the insulating layer separates the bottom metal-containing current terminal regions from the top metal-containing current terminal regions, thereby forming the nanosheet transistor device as a complementary FET device.

9. A method for forming a semiconductor device comprising:
providing a stack of alternating first and second semiconductor layers on a substrate, where the stack comprises a plurality of first semiconductor layers interspersed with a plurality of second semiconductor layers;
selectively etching the stack of alternating first and second semiconductor layers to form a transistor stack;
forming dielectric spacer layers on peripheral sides of the transistor stack which replace peripheral portions of the second semiconductor layers in the transistor stack and leave remnant second semiconductor layers in the transistor stack while leaving the first semiconductor layers exposed at sidewalls of the transistor stack; and
processing the transistor stack to form metal-containing current terminal regions adjacent to the transistor stack and to form control electrode portions between the first semiconductor layers which form transistor channel regions in the transistor stack to connect the metal-containing current terminal regions, thereby forming a nanosheet transistor device;
further comprising forming a dielectric wall backbone structure to separate the transistor stack into first stack of alternating first and second semiconductor layers and a second stack of alternating third and fourth semiconductor layers,
where processing the transistor stack to form metal-containing current terminal regions comprises:
forming first metal-containing current terminal regions on a first side of the dielectric wall backbone structure and on opposite ends of the first stack of alternating first and second semiconductor layers in electrical contact with silicide sidewall layers formed from the first semiconductor layers that are located in the first stack of alternating first and second semiconductor layers; and
forming second metal-containing current terminal regions on a second, opposite side of the dielectric wall backbone structure and on opposite ends of the second stack of alternating third and fourth semiconductor layers stack in electrical contact with silicide sidewall layers formed from the third semiconductor layers that are located in the second stack of alternating third and fourth semiconductor layers, thereby forming the nanosheet transistor device as a forksheet nanosheet transistor device
where the first semiconductor layers are formed with a first conductivity type semiconductor material, and where the third semiconductor layers are formed with a second, opposite conductivity type semiconductor material.

10. A method for forming a semiconductor device comprising:
forming a stack structure comprising alternating silicon and silicon germanium nanosheet layers on the substrate;
selectively etching the stack structure to form a patterned nanosheet stack of alternating silicon and silicon germanium nanosheet layers; and
processing the patterned nanosheet stack to form metal-containing current terminal structures adjacent to the patterned nanosheet stack and to form a nanosheet transistor comprising control terminal electrodes formed around at least three sides of the silicon nanosheet layers from the patterned nanosheet stack which are connected between the metal-containing current terminal structures formed on opposite sides of the patterned nanosheet stack;
where processing the patterned nanosheet stack comprises:
selectively processing the patterned nanosheet stack to form silicide sidewall layers on peripheral sides of the silicon nanosheet layers in the patterned nanosheet stack; and
forming one or more metal layers on opposite sides of the patterned nanosheet stack in electrical contact with the silicide sidewall layers to form the metal-containing current terminal structures which are adjacent to the patterned nanosheet stack.

11. A method for forming a semiconductor device comprising:
   forming a stack structure comprising alternating silicon and silicon germanium nanosheet layers on the substrate;
   selectively etching the stack structure to form a patterned nanosheet stack of alternating silicon and silicon germanium nanosheet layers; and
   processing the patterned nanosheet stack to form metal-containing current terminal structures adjacent to the patterned nanosheet stack and to form a nanosheet transistor comprising control terminal electrodes formed around at least three sides of the silicon nanosheet layers from the patterned nanosheet stack which are connected between the metal-containing current terminal structures formed on opposite sides of the patterned nanosheet stack;
   where processing the patterned nanosheet stack comprises:
      selectively processing the patterned nanosheet stack to form epitaxial semiconductor sidewall layers from the silicon nanosheet layers in the patterned nanosheet stack;
      forming silicide sidewall layers on the epitaxial semiconductor sidewall layers which are adjacent to the patterned nanosheet stack; and
      forming one or more metal layers on opposite sides of the patterned nanosheet stack in electrical contact with the silicide sidewall layers to form the metal-containing current terminal structures which are adjacent to the patterned nanosheet stack.

12. A method for forming a semiconductor device comprising:
   forming a stack structure comprising alternating silicon and silicon germanium nanosheet layers on the substrate;
   selectively etching the stack structure to form a patterned nanosheet stack of alternating silicon and silicon germanium nanosheet layers; and
   processing the patterned nanosheet stack to form metal-containing current terminal structures adjacent to the patterned nanosheet stack and to form a nanosheet transistor comprising control terminal electrodes formed around at least three sides of the silicon nanosheet layers from the patterned nanosheet stack which are connected between the metal-containing current terminal structures formed on opposite sides of the patterned nanosheet stack;
   where processing the patterned nanosheet stack comprises:
      selectively processing the patterned nanosheet stack to form doped epitaxial semiconductor regions adjacent to the patterned nanosheet stack;
      selectively etching the doped epitaxial semiconductor regions on peripheral sides of the patterned nanosheet stack to form doped epitaxial semiconductor sidewall layers on the sidewalls of the patterned nanosheet stack;
      forming silicide sidewall layers on the epitaxial semiconductor sidewall layers which are adjacent to the patterned nanosheet stack; and
      forming one or more metal layers on opposite sides of the patterned nanosheet stack in electrical contact with the silicide sidewall layers to form the metal-containing current terminal structures which are adjacent to the patterned nanosheet stack.

13. A method for forming a semiconductor device comprising:
   forming a stack structure comprising alternating silicon and silicon germanium nanosheet layers on the substrate;
   selectively etching the stack structure to form a patterned nanosheet stack of alternating silicon and silicon germanium nanosheet layers; and
   processing the patterned nanosheet stack to form metal-containing current terminal structures adjacent to the patterned nanosheet stack and to form a nanosheet transistor comprising control terminal electrodes formed around at least three sides of the silicon nanosheet layers from the patterned nanosheet stack which are connected between the metal-containing current terminal structures formed on opposite sides of the patterned nanosheet stack;
   where processing the patterned nanosheet stack comprises:
      selectively processing the patterned nanosheet stack to form dielectric spacer layers on peripheral sides of the patterned nanosheet stack which replace peripheral portions of the silicon germanium nanosheet layers in the patterned nanosheet stack and leave remnant silicon germanium nanosheet layers in the patterned nanosheet stack; and
      selectively processing the patterned nanosheet stack to form control terminal electrodes which replace the remnant silicon germanium nanosheet layers in the patterned nanosheet stack, thereby forming the nanosheet transistor.

14. A method for forming a semiconductor device comprising:
   forming a stack structure comprising alternating silicon and silicon germanium nanosheet layers on the substrate;
   selectively etching the stack structure to form a patterned nanosheet stack of alternating silicon and silicon germanium nanosheet layers; and
   processing the patterned nanosheet stack to form metal-containing current terminal structures adjacent to the patterned nanosheet stack and to form a nanosheet transistor comprising control terminal electrodes formed around at least three sides of the silicon nanosheet layers from the patterned nanosheet stack which are connected between the metal-containing current terminal structures formed on opposite sides of the patterned nanosheet stack;
   where processing the patterned nanosheet stack to form metal-containing current terminal regions comprises:
      selectively etching the silicon nanosheet layers on peripheral sides of the patterned nanosheet stack to form partially etched first silicon nanosheet layers having recessed sidewalls;
      forming silicide sidewall layers on the recessed sidewalls of the partially etched first silicon nanosheet layers; and
      forming one or more metal layers on opposite sides of the transistor stack in electrical contact with the silicide sidewall layers to form the metal-containing current terminal regions which are adjacent to the patterned nanosheet stack.

* * * * *